United States Patent
Choi et al.

(10) Patent No.: US 11,791,173 B2
(45) Date of Patent: Oct. 17, 2023

(54) SUBSTRATE CLEANING EQUIPMENT, SUBSTRATE TREATMENT SYSTEM INCLUDING THE SAME, AND METHOD OF FABRICATING SEMICONDUCTOR DEVICE USING THE SUBSTRATE CLEANING EQUIPMENT

(71) Applicant: SAMSUNG ELECTRONICS CO., LTD., Suwon-si (KR)

(72) Inventors: Seung Hoon Choi, Suwon-si (KR); Ja Eung Koo, Suwon-si (KR); No Ui Kim, Suwon-si (KR); Hyun Kyo Seo, Suwon-si (KR); Tae Min Earmme, Suwon-si (KR); Bo Un Yoon, Suwon-si (KR); Youn Cheol Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 507 days.

(21) Appl. No.: 16/741,002

(22) Filed: Jan. 13, 2020

(65) Prior Publication Data
US 2020/0303218 A1 Sep. 24, 2020

(30) Foreign Application Priority Data

Mar. 21, 2019 (KR) .................. 10-2019-0032129
Jul. 16, 2019 (KR) .................. 10-2019-0085475

(51) Int. Cl.
*H01L 21/67* (2006.01)
*H01L 21/02* (2006.01)
*B24B 37/34* (2012.01)

(52) U.S. Cl.
CPC ........ *H01L 21/67051* (2013.01); *B24B 37/34* (2013.01); *H01L 21/02057* (2013.01); *H01L 21/02096* (2013.01); *H01L 21/67046* (2013.01)

(58) Field of Classification Search
CPC ......... H01L 21/67051; H01L 21/02057; H01L 21/02096; H01L 21/67046; B24B 37/34
(Continued)

(56) References Cited

U.S. PATENT DOCUMENTS 8,844,546 B2   9/2014  Chen et al.
9,142,399 B2   9/2015  Ishibashi
(Continued)

FOREIGN PATENT DOCUMENTS

KR    20090037075 A  *  4/2009

OTHER PUBLICATIONS

KR20090037075A—Machine translation (Year: 2009).*

*Primary Examiner* — Tinsae B Ayalew
(74) *Attorney, Agent, or Firm* — F. Chau & Associates, LLC

(57) ABSTRACT

Substrate cleaning equipment includes a substrate holder which supports a substrate, a swing body, a head, a first cleaning liquid supply structure, and a second cleaning liquid supply structure. The swing body moves along a sweep line on a main surface of the substrate. The head is coupled to the swing body and includes a pad attachment surface facing the substrate holder. The first cleaning liquid supply structure is coupled to the swing body and sprays a first cleaning liquid onto the main surface of the substrate. The second cleaning liquid supply structure sprays a second cleaning liquid onto the main surface of the substrate. A buffing pad is attached to the pad attachment surface.

15 Claims, 25 Drawing Sheets

(58) Field of Classification Search
USPC .......................................................... 134/94.1
See application file for complete search history.

(56) References Cited

U.S. PATENT DOCUMENTS

| | | | |
|---|---|---|---|
| 9,711,381 B2 | 7/2017 | Ko et al. | |
| 10,032,655 B2 | 7/2018 | Sakurai et al. | |
| 10,170,343 B1 | 1/2019 | Wei et al. | |
| 10,229,842 B2 | 3/2019 | Sakata et al. | |
| 2014/0209239 A1* | 7/2014 | Ko | H01L 21/67051 |
| | | | 15/97.1 |
| 2016/0099156 A1 | 4/2016 | Yamaguchi et al. | |
| 2016/0329219 A1* | 11/2016 | Lee | B08B 3/10 |

\* cited by examiner

SUBSTRATE CLEANING EQUIPMENT, SUBSTRATE TREATMENT SYSTEM INCLUDING THE SAME, AND METHOD OF FABRICATING SEMICONDUCTOR DEVICE USING THE SUBSTRATE CLEANING EQUIPMENT

CROSS-REFERENCE TO RELATED APPLICATIONS

This application claims priority under 35 U.S.C. § 119 to Korean Patent Application No. 10-2019-0032129, filed on Mar. 21, 2019, and Korean Patent Application No. 10-2019-0085475, filed on Jul. 16, 2019, in the Korean Intellectual Property Office, the disclosures of which are incorporated by reference herein in their entireties.

TECHNICAL FIELD

Exemplary embodiments of the present disclosure relate to substrate cleaning equipment, a substrate treatment system including the same, and a method of fabricating a semiconductor device using the substrate cleaning equipment. More particularly, exemplary embodiments of the present disclosure relate to substrate cleaning equipment which cleans a substrate after a chemical mechanical planarization (CMP) process has been performed, and a system and method using the substrate cleaning equipment.

DISCUSSION OF THE RELATED ART

After a chemical mechanical planarization (CMP) process is performed on a substrate, the substrate is generally cleaned to remove unwanted residues and particles from the substrate. For example, slurry, a polished substrate material, or other residues may adhere to the substrate including an edge bezel of the substrate.

To remove unwanted materials from the substrate after the CMP process has been performed, the substrate may be rinsed. In addition, after the CMP process has been performed, the substrate may be transferred to cleaning modules such as a scrubber brush box and a megasonic tank. However, some particles and residues remaining after the CMP process has been performed may be difficult to remove using cleaning methods such as brush box scrubbing and megasonic tank immersion.

SUMMARY

Aspects of the present disclosure provide substrate cleaning equipment which can better remove particles from a substrate after a chemical mechanical planarization (CMP) process has been performed by changing the design of a nozzle for spraying a cleaning liquid.

Aspects of the present disclosure also provide a substrate treatment system which can better remove particles from a substrate after a CMP process has been performed by changing the design of a nozzle for spraying a cleaning liquid.

Aspects of the present disclosure also provide a method of fabricating a semiconductor device with improved yield and reliability by using substrate cleaning equipment in which the design of a nozzle for spraying a cleaning liquid has been changed.

According to an aspect of the present disclosure, substrate cleaning equipment includes a substrate holder which supports a substrate, a swing body, a head, a first cleaning liquid supply structure, and a second cleaning liquid supply structure. The swing body moves along a sweep line on a main surface of the substrate. The head is coupled to the swing body and includes a pad attachment surface facing the substrate holder. The first cleaning liquid supply structure is coupled to the swing body and sprays a first cleaning liquid onto the main surface of the substrate. The second cleaning liquid supply structure sprays a second cleaning liquid onto the main surface of the substrate. A buffing pad is attached to the pad attachment surface, the first cleaning liquid supply structure includes a first nozzle arm movably coupled to the swing body and a first cleaning liquid supply nozzle coupled to the first nozzle arm, and a rotation direction of the substrate is the same as a rotation direction of the buffing pad.

According to another aspect of the present disclosure, substrate cleaning equipment includes a substrate holder which supports a substrate, a swing body, a head, a first cleaning liquid cleaning liquid supply structure, and a second cleaning liquid supply structure. The swing body moves along a sweep line on a main surface of the substrate. The head is coupled to the swing body and includes a pad attachment surface facing the substrate holder. The first cleaning liquid supply structure is coupled to the swing body and sprays a first cleaning liquid onto the main surface of the substrate. The second cleaning liquid supply structure is coupled to the swing body and sprays a second cleaning liquid onto the main surface of the substrate. A buffing pad is attached to the pad attachment surface.

According to another aspect of the present disclosure, a substrate treatment system for treating a substrate includes chemical mechanical planarization (CMP) equipment and substrate cleaning equipment which receives the substrate after a main surface of the substrate is planarized by the CMP equipment. The substrate cleaning equipment includes a substrate holder which supports the substrate, a swing body, a head, a first cleaning liquid supply structure, and a second cleaning liquid supply structure. The swing body moves along a sweep line on the main surface of the substrate. The head is coupled to the swing body and includes a pad attachment surface facing the substrate holder. The first cleaning liquid supply structure is coupled to the swing body and sprays a first cleaning liquid onto the main surface of the substrate. The second cleaning liquid supply structure sprays a second cleaning liquid onto the main surface of the substrate. A buffing pad is attached to the pad attachment surface, and the first cleaning liquid supply structure includes a first nozzle arm movably coupled to the swing body and a first cleaning liquid supply nozzle coupled to the first nozzle arm.

According to another aspect of the present disclosure, a method of fabricating a semiconductor device includes planarizing a main surface of a substrate using a CMP process, and cleaning the planarized main surface of the substrate using substrate cleaning equipment. The substrate cleaning equipment includes a substrate holder which supports the substrate, a swing body, a head, a first cleaning liquid supply structure, and a second cleaning liquid supply structure. The swing body moves along a sweep line on the main surface of the substrate. The head is coupled to the swing body and includes a pad attachment surface facing the substrate holder. The first cleaning liquid supply structure is coupled to the swing body and sprays a first cleaning liquid onto the main surface of the substrate. The second cleaning liquid supply structure sprays a second cleaning liquid onto the main surface of the substrate. A buffing pad is attached to the pad attachment surface, and the first cleaning liquid supply structure includes a first nozzle arm movably coupled to the swing body and a first cleaning liquid supply nozzle coupled to the first nozzle arm.

BRIEF DESCRIPTION OF THE DRAWINGS

The above and other aspects of the present disclosure will become more apparent by describing in detail exemplary embodiments thereof with reference to the accompanying drawings, in which.

DETAILED DESCRIPTION

Figure 1:
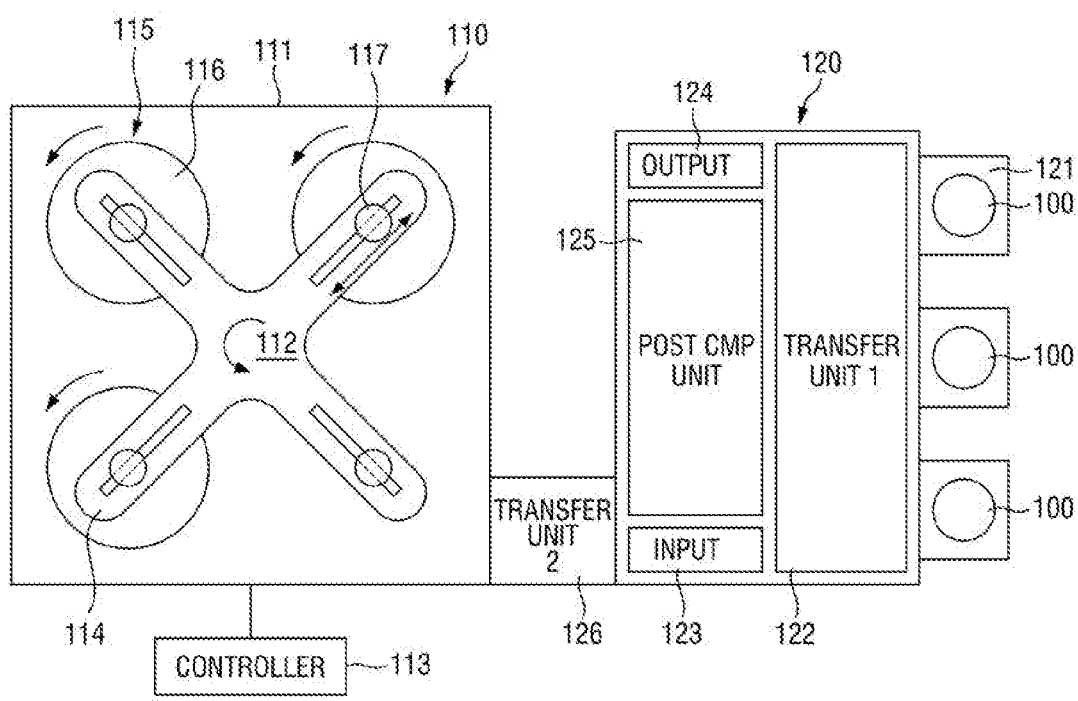
FIG. 1 is a schematic top view of a substrate treatment system including substrate cleaning equipment according to exemplary embodiments.

Exemplary embodiments of the present disclosure will be described more fully hereinafter with reference to the accompanying drawings. Like reference numerals may refer to like elements throughout the accompanying drawings.

It should be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

It should be understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Other uses of the word "substantially" should be construed in a similar manner.

FIG. 1 is a schematic top view of a substrate treatment system including substrate cleaning equipment according to exemplary embodiments.

In FIG. 1, the substrate cleaning system is illustrated as including the substrate cleaning equipment according to exemplary embodiments. However, exemplary embodiments are not limited thereto. For example, in some exemplary embodiments, the substrate cleaning equipment may be used alone or together with substrate treatment systems having alternative configurations.

Referring to FIG. 1, the substrate treatment system may include chemical mechanical planarization (CMP) equipment 110 and a factory interface 120.

The CMP equipment 110 may include an enclosure 111, a carousel 112, a controller 113, and one or more CMP stations 115.

The enclosure 111 may be a space that is environmentally controlled so that a CMP process can be performed. The carousel 112 and the CMP stations 115 may be disposed inside the enclosure 111.

The carousel 112 may be disposed, for example, at or near a center of the enclosure 111. The carousel 112 may include a plurality of support arms 114 respectively supporting polishing heads 117. Substrates 100 on which a CMP process is to be performed are loaded onto the polishing heads 117.

The carousel 112 may move the polishing heads 117 onto the CMP stations 115 by rotating the support arms 114. The polishing heads 117 loaded with the substrates 100 may be moved to an area above polishing pads 116.

The controller 113 may facilitate the control and integration of the CMP equipment 110 and the factory interface 120 included in the substrate treatment system. The controller 113 may be coupled to various components of the substrate treatment system in order to facilitate the control of, e.g., planarization, cleaning, and transfer processes. The controller may be implemented as a circuit, and may also be referred to herein as a controller circuit.

The CMP stations 115 may planarize the substrates 100 loaded on the polishing heads 117. When a plurality of CMP stations 115 is provided, the CMP stations 115 may planarize different materials, respectively. However, exemplary embodiments are not limited to this case.

In FIG. 1, three CMP stations 115 and four support arms 114 are illustrated. However, exemplary embodiments are not limited to this case.

The factory interface 120 may include substrate cassettes 121, a first transfer unit 122, a second transfer unit 126, an input module 123, a post CMP unit 125, and an output module 124.

The substrate cassettes 121 may store the substrates 100 before or after a CMP process is performed.

The first transfer unit 122 may move a substrate 100 before a CMP process is performed from a substrate cassette 121 to the input module 123. Alternatively, the first transfer unit 122 may move the substrate 100 after the CMP process is performed from the input module 123 to the post CMP unit 125. Alternatively, the first transfer unit 122 may move the substrate 100 within the post CMP unit 125 or move the substrate 100 from the post CMP unit 125 to the output module 124. Alternatively, the first transfer unit 122 may move the substrate 100 post-treated after the CMP process is performed from the output module 124 to the substrate cassette 121.

The input module 123 may store a substrate 100 before being put into the CMP equipment 110. Alternatively, the input module 123 may store a substrate 100 taken out of the CMP equipment 110 and before being put into the post CMP unit 125.

The second transfer unit 126 may move a substrate 100 between the input module 123 and the CMP equipment 110. In FIG. 1, the second transfer unit 126 is illustrated as being located outside the CMP equipment 110. However, this is merely an example used for ease of description, and exemplary embodiments are not limited to this example. For example, in exemplary embodiments, a part of the second transfer unit 126 may also be disposed inside the enclosure 111 of the CMP equipment 110.

The post CMP unit 125 may remove unwanted residues or particles that may remain on a substrate 100 after a CMP process has been performed. The post CMP unit 125 will be described in further detail below.

The output module 124 may store a substrate 100 post-treated after a CMP process has been performed.

In exemplary embodiments, one or more components included in the factory interface 120 of FIG. 1 may be combined into one component. Conversely, one component included in the factory interface 120 of FIG. 1 may be separated into a plurality of components.

The substrate treatment system may operate as follows. A substrate 100 may be transferred from one of the substrate cassettes 121 to the input module 123 by the first transfer unit 122. Then, the second transfer unit 126 may load the substrate 100 from the input module 123 to one of the polishing heads 117 of the CMP equipment 110. The substrate 100 loaded on the polishing head 117 may be oriented horizontally (e.g., substantially parallel to the ground). The substrate 100 loaded on the polishing head 117 may be moved to above the polishing pad 116 of one of the CMP stations 115 and then may be polished. After the substrate 100 is polished, the polished substrate 100 may be transferred to the input module 123 by the second transfer unit 126. Then, the first transfer unit 122 may collect the polished substrate 100 and transfer the polished substrate 100 to the post CMP unit 125. While the substrate 100 is cleaned, it may be oriented vertically in each piece of cleaning equipment of the post CMP unit 125. The post-treated substrate 100 is transferred to the output module 124. The first transfer unit 122 may transfer the post-treated substrate 100 to the substrate cassette 121 while returning the post-treated substrate 100 to the horizontal orientation.

Figure 2:
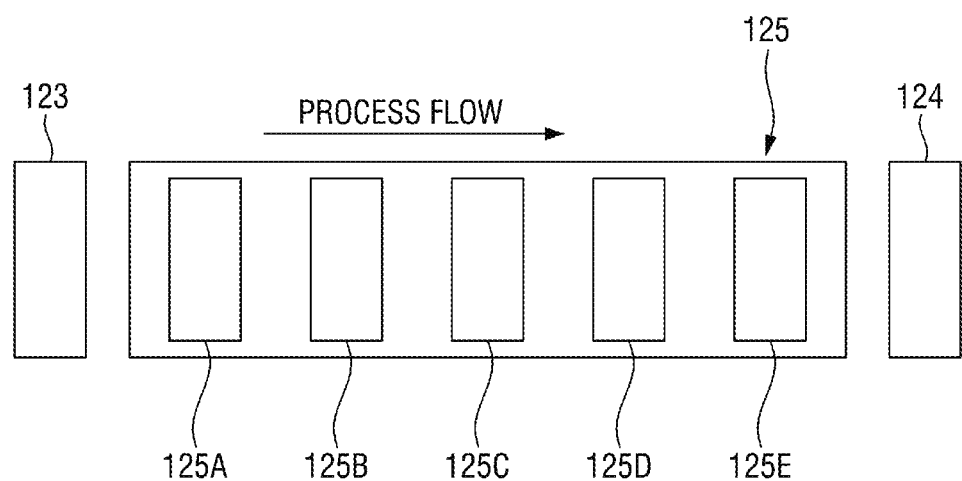
FIG. 2 schematically illustrates a post chemical mechanical planarization (CMP) unit including substrate cleaning equipment according to exemplary embodiments.

FIG. 2 schematically illustrates a post CMP unit 125 including substrate cleaning equipment 125B according to exemplary embodiments.

In FIG. 2, the post CMP unit 125 may include, for example, megasonic equipment 125A, the substrate cleaning equipment 125B, first brush equipment 125C, second brush equipment 125D, and substrate drying equipment 125E.

The substrate cleaning equipment 125B may remove residues or particles that may remain on a substrate after a CMP process is performed using a chemical and physical method. The substrate cleaning equipment 125B may be, for example, particle cleaning equipment.

A substrate stored in the input module 123 may be moved to the output module 124 sequentially through the megasonic equipment 125A, the substrate cleaning equipment 125B, the first brush equipment 125C, the second brush equipment 125D, and the substrate drying equipment 125E.

In each of the megasonic equipment 125A, the substrate cleaning equipment 125B, the first brush equipment 125C, the second brush equipment 125D, and the substrate drying equipment 125E, the substrate may be loaded and treated while it is vertically oriented, for example, while its polished surface is oriented substantially vertically (e.g., in the direction of gravity).

In FIG. 2, the post CMP unit 125 includes four types of post-treatment equipment in addition to the substrate cleaning equipment 125B. However, exemplary embodiments are not limited to this case.

Figure 3:
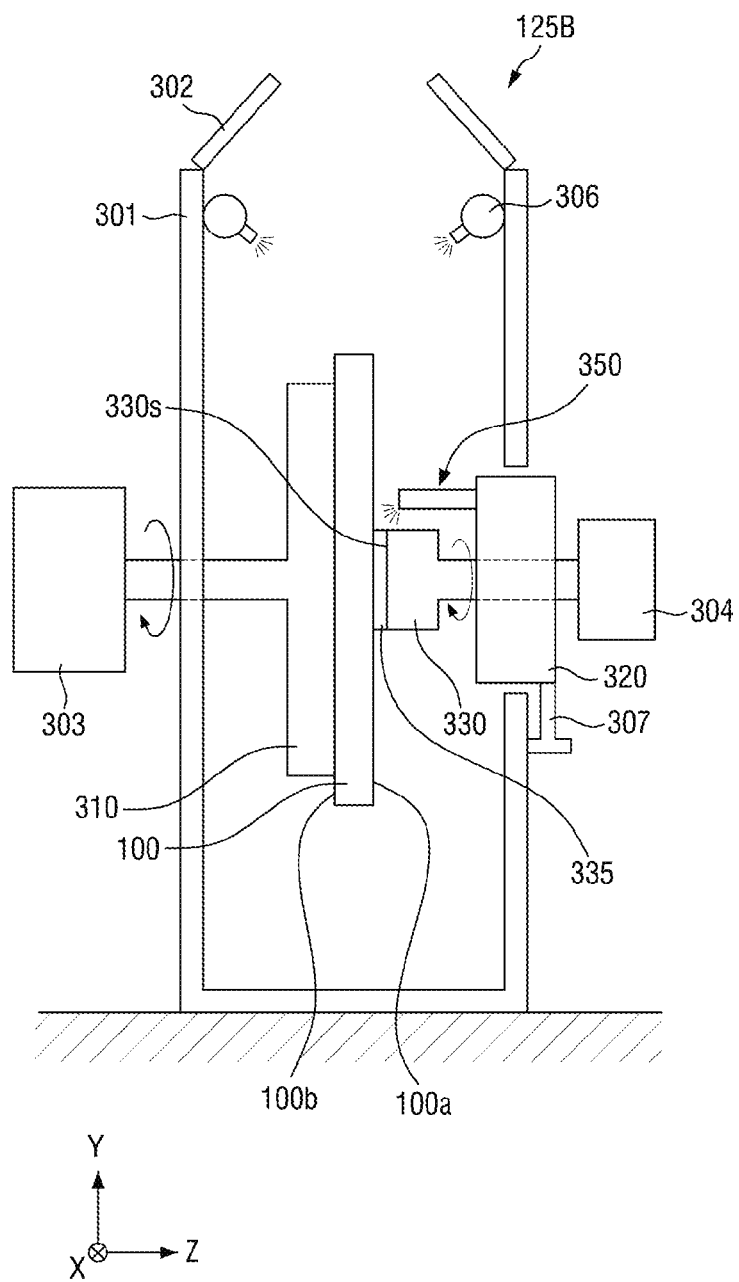
FIG. 3 is a cross-sectional view of substrate cleaning equipment according to exemplary embodiments.
Figure 4:
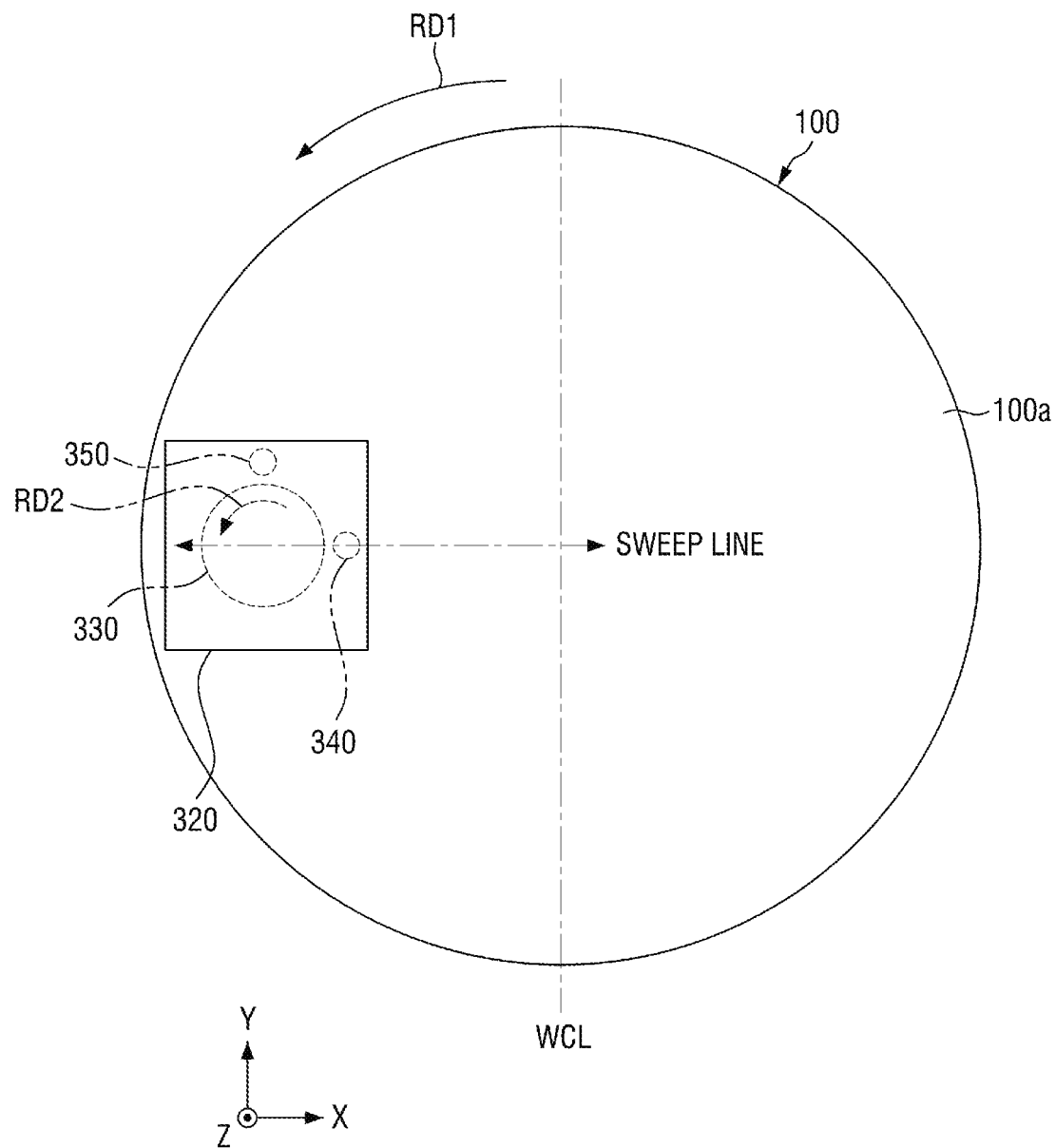
FIG. 4 illustrates a substrate, a head, a swing body, and first and second cleaning liquid supply structures of FIG. 3.
Figure 5:
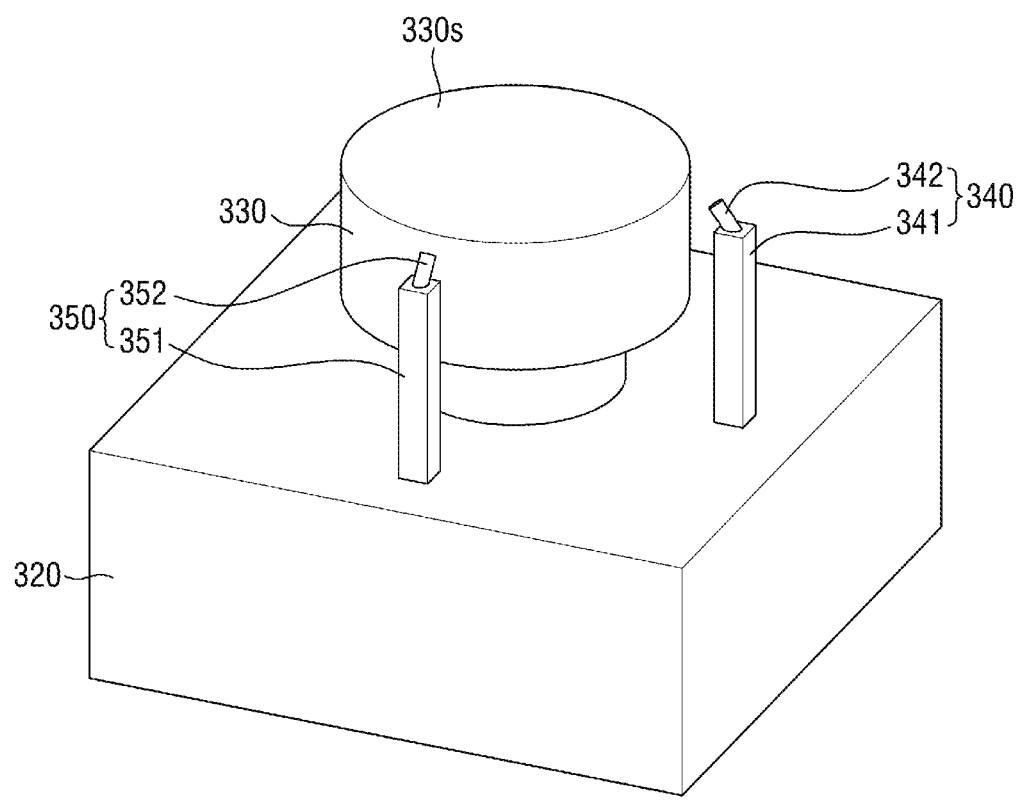
FIG. 5 is a diagram illustrating the structure of the head, the swing body, and the first and second cleaning liquid supply structures of FIG. 3.
Figure 6:
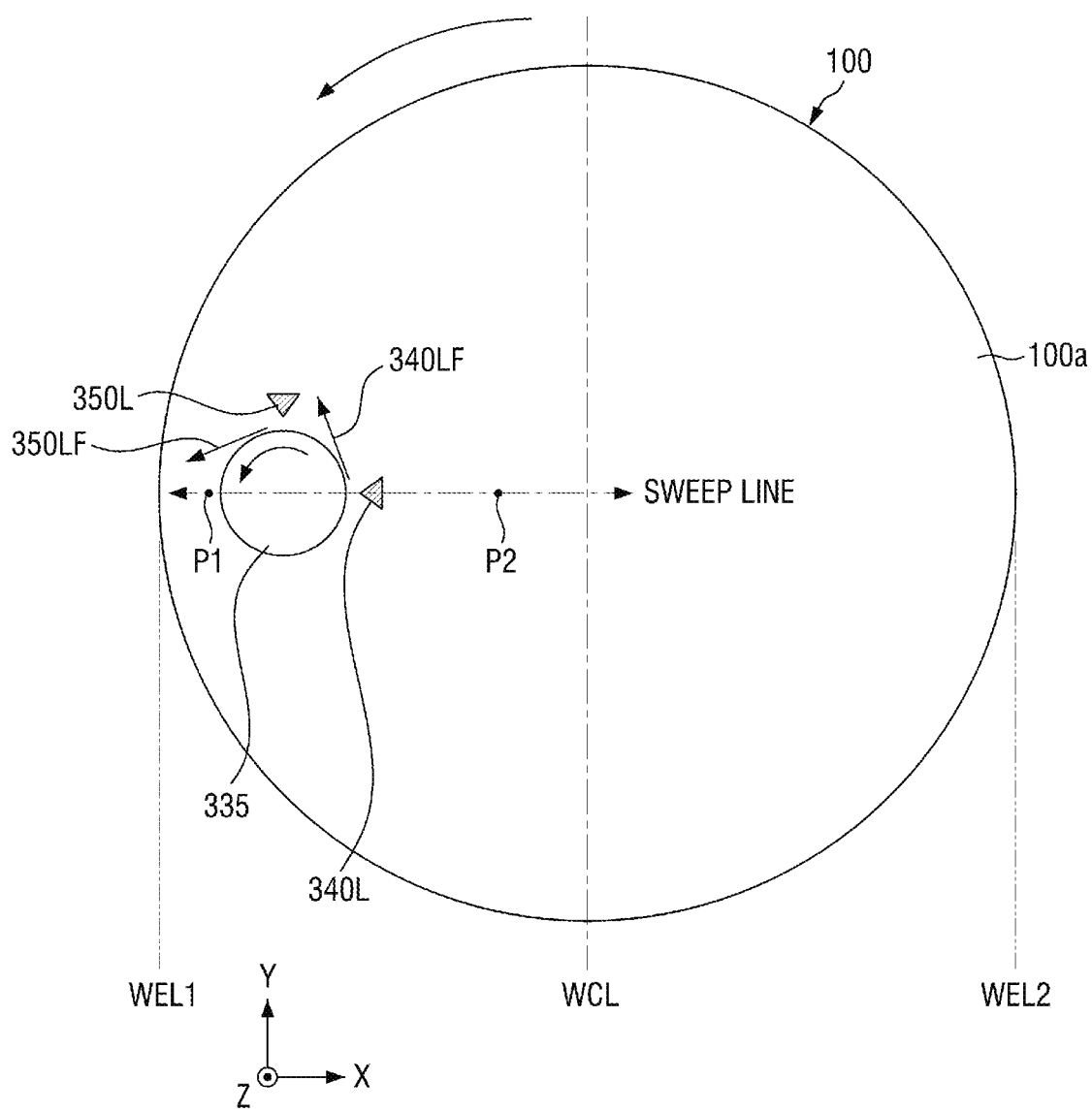
FIGS. 6 and 7 are diagrams illustrating the operation of the substrate cleaning equipment when the substrate rotates in a counterclockwise direction.
Figure 7:
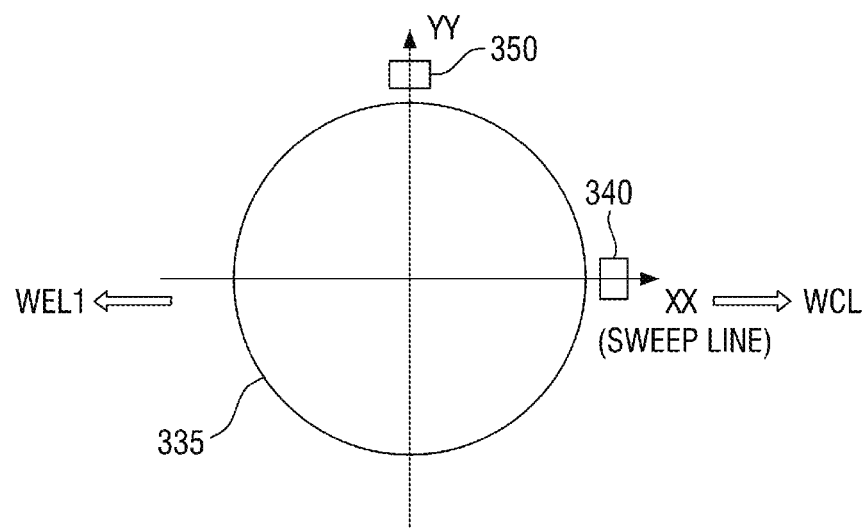
Figure 8:
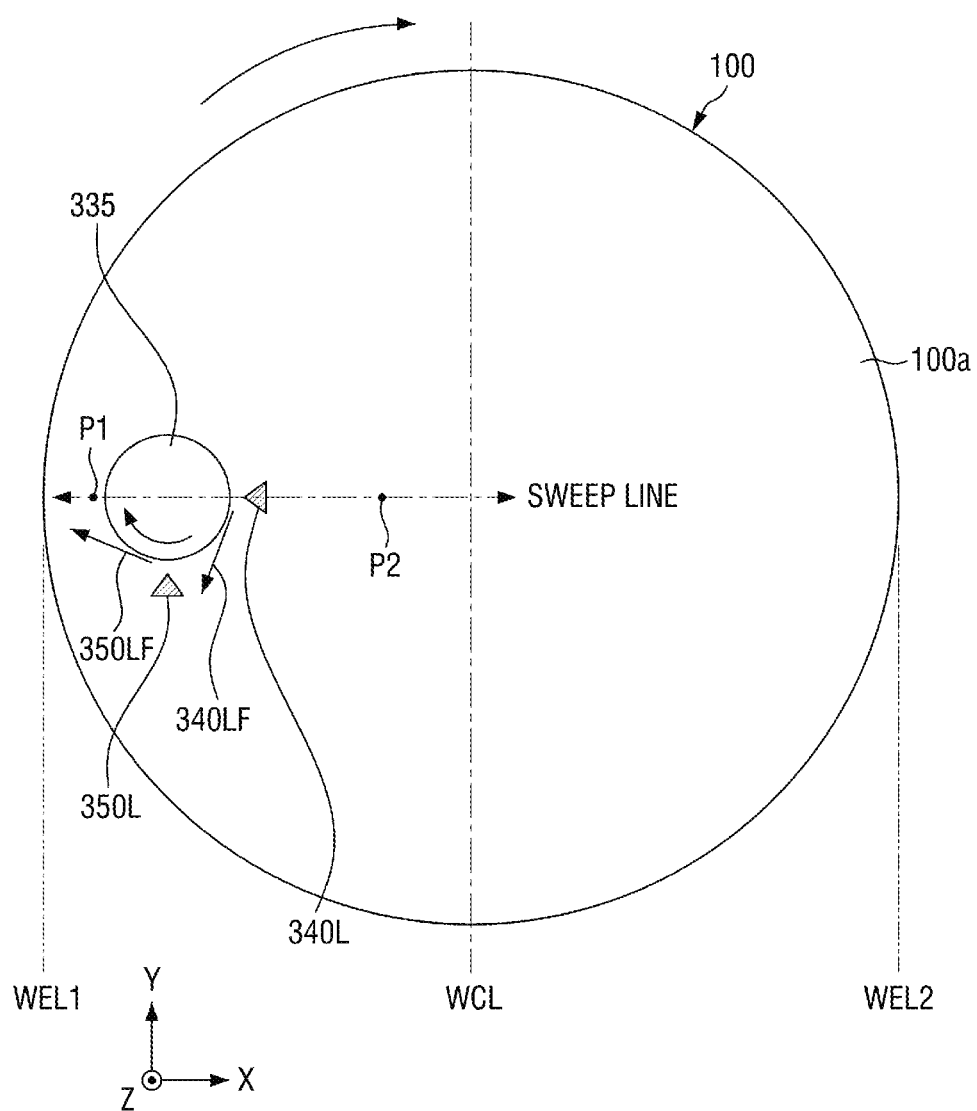
FIG. 8 is a diagram illustrating the operation of the substrate cleaning equipment when the substrate rotates in a clockwise direction.

FIG. 3 is a cross-sectional view of substrate cleaning equipment 125B according to exemplary embodiments. FIG. 4 illustrates a substrate 100, a head 330, a swing body 320, and first and second cleaning liquid supply structures 340 and 350 of FIG. 3. FIG. 5 is a diagram illustrating the structure of the head 330, the swing body 320, and the first and second cleaning liquid supply structures 340 and 350 of FIG. 3. FIGS. 6 and 7 are diagrams illustrating the operation of the substrate cleaning equipment 125B when the substrate 100 rotates in a counterclockwise direction. FIG. 8 is a diagram illustrating the operation of the substrate cleaning equipment 125B when the substrate 100 rotates in a clockwise direction.

For reference, FIG. 4 is a top view as seen from above a main surface 100a of the substrate 100.

Referring to FIGS. 3 through 5, the substrate cleaning equipment 125B according to exemplary embodiments may include a housing 301, a substrate holder 310, the swing body 320, the head 330, the first cleaning liquid supply structure 340, and the second cleaning liquid supply structure 350.

The housing 301 may provide an internal space for cleaning the substrate 100. The housing 301 may include a cover 302 which may be opened or closed to allow the substrate 100 to enter or leave the housing 301. For example, as shown in FIG. 3, the cover 302 may include two portions that close downward to cover the housing 301 and open upward to open the housing 301. However, exemplary embodiments are not limited to this case. In exemplary embodiments, the housing 301 may include a drain formed at a bottom of the housing 301. A fluid used to clean the substrate 100 may be removed through the drain.

The substrate holder 310 may be accommodated in the housing 301. The substrate 100 may be loaded onto the substrate holder 310. The substrate holder 310 may support the substrate 100. The substrate holder 310 may be coupled to a first rotating device 303. The first rotating device 303 may rotate the substrate holder 310. While the substrate holder 310 rotates, the substrate 100 loaded on the substrate holder 310 also rotates.

The substrate holder 310 may be one of, for example, an electrostatic chuck, a vacuum chuck, and a mechanical gripper. Alternatively, the substrate holder 310 may be any suitable mechanism for holding the substrate 100 firmly while the substrate 100 is cleaned within the substrate cleaning equipment 125B.

The substrate 100 may include the main surface 100a and a bottom surface 100b which face each other. The main surface 100a of the substrate 100 may also be referred to herein as a top surface of the substrate 100. The main surface 100a of the substrate 100 may be a surface on which a CMP process is performed. The main surface 100a of the substrate 100 may be a surface planarized by the CMP equipment 110 (see FIG. 1). For example, the main surface 100a of the substrate 100 may be a surface on which semiconductor elements and the like are formed.

The substrate 100 may be loaded onto the substrate holder 310 such that the main surface 100a of the substrate 100 faces the swing body 320. The substrate holder 310 may support the loaded substrate 100 to keep the substrate 100 oriented in a second direction Y (e.g., the direction of gravity or a substantially vertical direction). While the main surface 100a of the substrate 100 is cleaned using a buffing pad 335, the substrate holder 310 may keep the substrate 100 oriented vertically.

The swing body 320 may be spaced apart from the substrate holder 310 in a third direction Z. The swing body 320 may be disposed on the main surface 100a of the substrate 100 loaded on the substrate holder 310.

During the operation of the substrate cleaning equipment 125B, the swing body 320 may move in a substantially straight line along a first direction X on the main surface 100a of the substrate 100. The swing body 320 may move along a sweep line SWEEP LINE on the main surface 100a of the substrate 100.

The first direction X may be a direction substantially parallel to the sweep line SWEEP LINE. The sweep line SWEEP LINE may pass through a center of the substrate 100 and pass through a substrate center line WCL substantially parallel to the second direction Y. The substrate center line WCL may be located at or near the center of the substrate 100.

The swing body 320 may be coupled to a linear motion device 307. The linear motion device 307 may move the swing body 320 along the first direction X. For example, the swing body 320 may reciprocate along the sweep line SWEEP LINE. For example, the swing body 320 may move back and forth along the sweep line SWEEP LINE in the first direction X.

The head 330 may be disposed inside the housing 301. The head 330 may be coupled to the swing body 320. The head 330 may include a pad attachment surface 330s to which the buffing pad 335 is attached. The pad attachment surface 330s of the head 330 may face the substrate holder 310. The pad attachment surface 330s of the head 330 may face the main surface 100a of the substrate 100.

The head 330 may be coupled to a second rotating device 304. The second rotating device 304 may rotate the head 330. While the head 330 rotates, the buffing pad 335 attached to the pad attachment surface 330s may rotate.

While the swing body 320 moves along the first direction X, the head 330 coupled to the swing body 320 may also move along the first direction X. During the operation of the substrate cleaning equipment 125B, the head 330 may move in a substantially straight line along the first direction X while rotating. For example, the head 330 may also move in a straight line along the sweep line SWEEP LINE. Here, the "sweep line" SWEEP LINE may be a line connecting areas through which a center of the pad attachment surface 330s of the head 330 passes.

The substrate holder 310 may rotate in a first rotation direction RD1. Since the substrate holder 310 rotates in the first rotation direction RD1, the substrate 100 may also rotate in the first rotation direction RD1. The head 330 disposed on the main surface 100a of the substrate 100 may rotate in a second rotation direction RD2.

In the substrate cleaning equipment 125B according to exemplary embodiments, the first rotation direction RD1 in which the substrate 100 rotates may be the same direction as the second rotation direction RD2 in which the head 330 rotates.

Here, the "rotation direction" refers to a direction in which the substrate 100 rotates about a direction (−Z direction) in which the substrate 100 is seen from the swing body 320. For example, each of the first rotation direction RD1 and the second rotation direction RD2 in FIG. 4 may be the counterclockwise direction. However, exemplary embodiments are not limited to this case.

Each of the first cleaning liquid supply structure 340 and the second cleaning liquid supply structure 350 may be coupled to the swing body 320. The first cleaning liquid supply structure 340 may spray a first cleaning liquid 340L (see FIG. 6) onto the main surface 100a of the substrate 100. The second cleaning liquid supply structure 350 may spray a second cleaning liquid 350L (see FIG. 6) onto the main surface 100a of the substrate 100.

During the operation of the substrate cleaning equipment 125B, the first cleaning liquid supply structure 340 and the second cleaning liquid supply structure 350 may spray the first cleaning liquid 340L and the second cleaning liquid 350L at a boundary of the buffing pad 335 which meets the main surface 100a of the substrate 100. Each of the first cleaning liquid supply structure 340 and the second cleaning liquid supply structure 350 may adjust a flow rate of cleaning liquid sprayed according to operating conditions of the substrate cleaning equipment 125B.

Each of the first cleaning liquid 340L and the second cleaning liquid 350L may include a chemical solution. The chemical solution may chemically separate, for example, residues or particles attached to the main surface 100a of the substrate 100 from the main surface 100a of the substrate 100.

While the swing body 320 moves along the first direction X, the first cleaning liquid supply structure 340 and the second cleaning liquid supply structure 350 may also move along the first direction X. Each of the first cleaning liquid supply structure 340 and the second cleaning liquid supply structure 350 may spray a cleaning liquid onto the main surface 100a of the substrate 100 while moving along the first direction X.

The first cleaning liquid supply structure 340 may include a first nozzle arm 341 and a first cleaning liquid supply nozzle 342. The first nozzle arm 341 may be coupled to the swing body 320. The first cleaning liquid supply nozzle 342 may be coupled to the first nozzle arm 341.

The second cleaning liquid supply structure 350 may include a second nozzle arm 351 and a second cleaning liquid supply nozzle 352. The second nozzle arm 351 may be coupled to the swing body 320. The second cleaning liquid supply nozzle 352 may be coupled to the second nozzle arm 351.

The first cleaning liquid supply structure 340 and the second cleaning liquid supply structure 350 may be connected to liquid sources which supply the first cleaning liquid 340L and the second cleaning liquid 350L, respectively.

For example, in exemplary embodiments, the first nozzle arm 341 and the second nozzle arm 351 may each include a hollow portion therein. The hollow portion of the first nozzle arm 341 may be connected to one of the liquid sources and to the first cleaning liquid supply nozzle 342, allowing liquid from the liquid source to travel through the first nozzle arm 341 and be sprayed onto the main surface 100a of the substrate 100 through the first cleaning liquid supply nozzle 342. Similarly, the hollow portion of the second nozzle arm 351 may be connected to the other one of the liquid sources and to the second cleaning liquid supply nozzle 352, allowing liquid from the other liquid source to travel through the second nozzle arm 351 and be sprayed onto the main surface 100a of the substrate 100 through the second cleaning liquid supply nozzle 352.

The position of each of the first cleaning liquid supply structure 340 and the second cleaning liquid supply structure 350 may vary according to the rotation direction of the substrate 100. This will be described in further detail below with reference to FIGS. 6 and 7.

A rinsing liquid supply structure 306 may be disposed inside the housing 301. The rinsing liquid supply structure 306 may provide deionized water or any suitable fluid for rinsing to the substrate 100. The rinsing liquid supply structure 306 may be connected to a liquid source.

The operation of the substrate cleaning equipment 125B when the substrate 100 rotates in the counterclockwise direction will now be described with reference to FIGS. 4, 6 and 7.

The swing body 320 may pass through a first point P1 and a second point P2 of the sweep line SWEEP LINE. For example, the first point P1 and the second point P2 are points disposed on the sweep line SWEEP LINE. A center of the head 330 also passes through the first point P1 and the second point P2. The first point P1 is closer to a first substrate edge line WEL1 than the second point P2 is to the first substrate edge line WEL1. For example, a distance between the first point P1 and the first substrate edge line WEL1 is less than a distance between the second point P2 and the first substrate edge line WEL1.

The first substrate edge line WEL1 is substantially parallel to the substrate center line WCL and meets the substrate 100 (e.g., meets an edge of the substrate 100). In addition, the first substrate edge line WEL1 is a line that meets the substrate 100 that is farthest away from the substrate center line WCL in the first direction X. A second substrate edge line WEL2 may correspond to the first substrate edge line WEL1 on an opposite side of the substrate 100 with respect to the substrate center line WCL. For example, the first substrate edge line WEL1 may meet a leftmost edge of the substrate 100 with respect to the substrate center line WCL, and the second substrate edge line WEL2 may meet a rightmost edge of the substrate 100 with respect to the substrate center line WCL.

When the buffing pad 335 moves along the sweep line SWEEP LINE as the substrate cleaning equipment 125B operates, a center of the buffing pad 335, for example, the center of the head 330, may pass through the substrate center line WCL. While moving along the sweep line SWEEP LINE, the buffing pad 335 may pass through the first substrate edge line WEL1 and the substrate center line WCL, but not through the second substrate edge line WEL2. For example, the buffing pad 335 may move about half of the main surface 100a of the substrate 100 without reaching the second substrate edge line WEL2. The movement of the swing body 320 along the sweep line SWEEP LINE may occur on a side of approximately the center (i.e., at exactly the center or near the center within a measurement error as would be understood by one having ordinary skill in the art) of the substrate 100, for example, on a side of the substrate center line WCL.

A direction from the first point P1 toward the second point P2 may be a positive first direction +X, and a direction from the second point P2 toward the first point P1 may be a negative first direction −X. A direction in which the buffing pad 335 is seen from the substrate 100 is a positive third direction +Z, and a direction in which the substrate 100 is seen from the buffing pad 335 is a negative third direction −Z. A positive second direction +Y and a negative second direction −Y can be described using FIG. 3. The positive second direction +Y may be a direction in which the substrate 100 exits out of the housing 301, and the negative second direction −Y may be a direction in which the substrate 100 enters into the housing 301.

An XX-YY plane may be defined in the swing body 320 overlapping the buffing pad 335 in the third direction Z. The origin of the XX-YY plane may be the center of the buffing pad 335. The center of the buffing pad 335 may be the center of the pad attachment surface 330s of the head 330.

In the XX-YY plane, an XX axis may be the sweep line SWEEP LINE. A YY axis is substantially perpendicular to the XX axis. A positive direction of the YY axis may be the positive second direction +Y, and a negative direction of the YY axis may be the negative second direction −Y.

In the XX-YY plane, each of the first cleaning liquid supply structure 340 and the second cleaning liquid supply structure 350 may be located in an area in which the YY axis of the XX-YY plane has a positive value. Alternatively, each of the first cleaning liquid supply structure 340 and the second cleaning liquid supply structure 350 may be located in an area in which the XX axis has a positive value.

In FIG. 7, the first cleaning liquid supply structure 340 may be located in the area in which the XX axis has a positive value. The second cleaning liquid supply structure 350 may be disposed in the area in which the YY axis of the XX-YY plane has a positive value. A line (XX axis) passing through the center of the buffing pad 335 and the first cleaning liquid supply structure 340 may be substantially perpendicular to a line (e.g., the YY axis) passing through the center of the buffing pad 335 and the second cleaning liquid supply structure 350.

It is to be understood that the position of each of the first cleaning liquid supply structure 340 and the second cleaning liquid supply structure 350 shown in FIG. 7 is merely an example, and exemplary embodiments are not limited thereto. For example, each of the first cleaning liquid supply structure 340 and the second cleaning liquid supply structure 350 may also be located at a position corresponding to a first quadrant or a second quadrant of the XX-YY plane.

The first cleaning liquid supply structure 340 may spray the first cleaning liquid 340L near a boundary at which the buffing pad 335 and the main surface 100a of the substrate 100 meet. Since the substrate 100 rotates in the counterclockwise direction and the first cleaning liquid 340L is affected by a centrifugal force, most of the first cleaning liquid 340L sprayed onto the main surface 100a of the substrate 100 moves in a first cleaning liquid flow direction 340LF toward a rim (e.g., an edge) of the substrate 100. Herein, the terms "rim" and "edge" may be used interchangeably. The first cleaning liquid 340L moving in the first cleaning liquid flow direction 340LF flows out of the substrate 100 through the rim of the substrate 100 instead of gathering at the center of the substrate 100.

The second cleaning liquid supply structure 350 may spray the second cleaning liquid 350L near the boundary at which the buffing pad 335 and the main surface 100a of the substrate 100 meet. Since the substrate 100 rotates in the counterclockwise direction and the second cleaning liquid 350L is affected by the centrifugal force, most of the second cleaning liquid 350L sprayed onto the main surface 100a of the substrate 100 moves in a second cleaning liquid flow direction 350LF toward the rim of the substrate 100. The second cleaning liquid 350L moving in the second cleaning liquid flow direction 350LF flows out of the substrate 100 through the rim of the substrate 100 instead of gathering at the center of the substrate 100.

Particles disposed on and/or attached to the main surface 100a of the substrate 100 may be chemically separated from the main surface 100a of the substrate 100 by the first cleaning liquid 340L and the second cleaning liquid 350L. In addition, particles disposed on and/or attached to the main surface 100a of the substrate 100 may be physically separated from the main surface 100a of the substrate 100 by the buffing pad 335. The particles chemically and physically separated from the main surface 100a of the substrate 100 may be moved together with the first cleaning liquid 340L and the second cleaning liquid 350L. For example, the particles separated from the main surface 100a of the substrate 100 may move to the rim of the substrate 100 along the first cleaning liquid flow direction 340LF and the second cleaning liquid flow direction 350LF, and then flow out of the substrate 100.

Alternatively, when each of the first cleaning liquid supply structure 340 and the second cleaning liquid supply structure 350 is located in an area in which the YY axis of the XX-YY plane has a negative value or an area in which the XX axis has a negative value, most of the first cleaning liquid 340L and most of the second cleaning liquid 350L may gather around the center of the substrate 100. In this case, particles separated from the main surface 100a of the substrate 100 may adhere again to the center or near the center of the main surface 100a of the substrate 100.

The operation of the substrate cleaning equipment 125B when the substrate 100 rotates in the clockwise direction will now be described with reference to FIGS. 4, 7 and 8. Here, for convenience of explanation, only differences from what has been described with reference to FIG. 6 may be described, and a further description of elements and aspects previously described may be omitted.

When the substrate 100 rotates in the clockwise direction, the second cleaning liquid supply structure 350, which sprays the second cleaning liquid 350L, may be disposed in the area in which the YY axis of the XX-YY plane has a negative value.

Unlike in FIG. 8, each of the first cleaning liquid supply structure 340 and the second cleaning liquid supply structure 350 may also be located at a position corresponding to a third quadrant or a fourth quadrant of the XX-YY plane.

Figure 9:
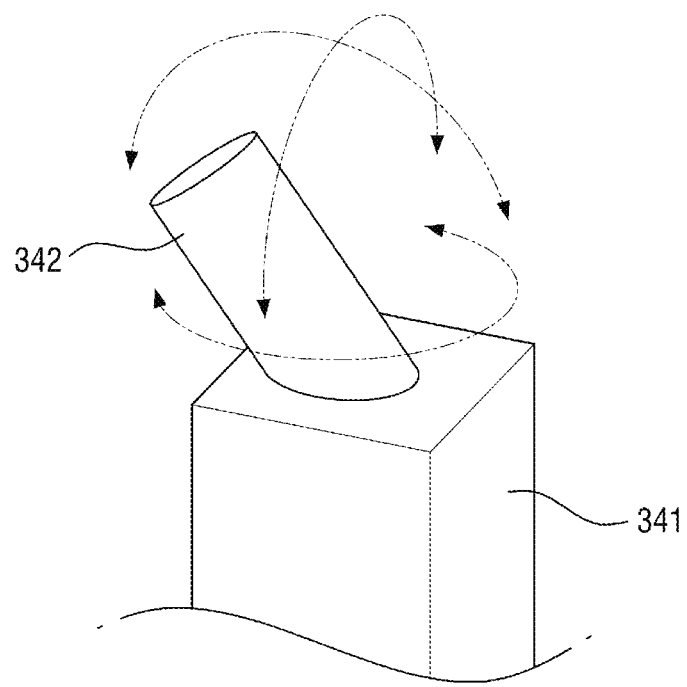
FIG. 9 illustrates substrate cleaning equipment according to exemplary embodiments.

FIG. 9 illustrates substrate cleaning equipment according to exemplary embodiments. For ease of description, the following description will focus primarily on differences from the exemplary embodiments described with reference to FIGS. 3 through 8, and a further description of elements and aspects previously described may be omitted.

For reference, FIG. 9 is a diagram used to describe the coupling relationship between a nozzle arm and a cleaning liquid supply nozzle.

Referring to FIGS. 5 and 9, in the substrate cleaning equipment according to an exemplary embodiment, a first cleaning liquid supply nozzle 342 may be rotatably coupled to a first nozzle arm 341.

The first cleaning liquid supply nozzle 342 may be coupled to the first nozzle arm 341 such that it can rotate in various directions with respect to the first nozzle arm 341.

By rotating the first cleaning liquid supply nozzle 342 with respect to the first nozzle arm 341, the efficiency of spraying the first cleaning liquid may be improved. For example, the first cleaning liquid supply nozzle 342 may be rotated with respect to the first nozzle arm 341 such that the first cleaning liquid is sprayed with a focus on the specific area(s) in need of being sprayed during a substrate cleaning process. For example, the first cleaning liquid may be specifically sprayed more onto the area(s) in need of being sprayed (e.g., an area(s) having a large concentration of unwanted residues or particles) as compared to other areas (e.g., an area(s) having a small concentration of unwanted residues or particles, or an area(s) having no unwanted residues or particles).

Similarly, a second cleaning liquid supply nozzle 352 may be rotatably coupled to a second nozzle arm 351.

In at least one of a first cleaning liquid supply structure 340 and a second cleaning liquid supply structure 350, a cleaning liquid supply nozzle may be rotatably coupled to a nozzle arm, as described above.

Figure 10:
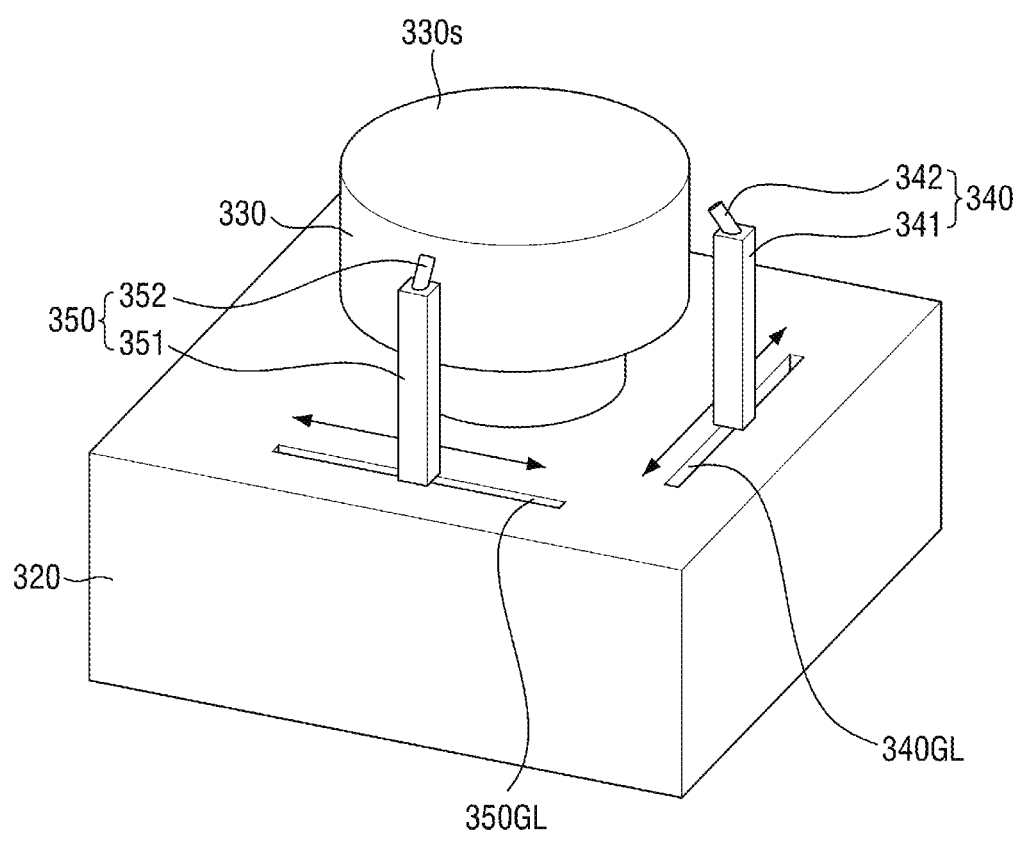
FIG. 10 illustrates substrate cleaning equipment according to exemplary embodiments.

FIG. 10 illustrates substrate cleaning equipment according to exemplary embodiments. For ease of description, the following description will focus primarily on differences from the exemplary embodiments described with reference to FIGS. 3 through 8, and a further description of elements and aspects previously described may be omitted.

For reference, FIG. 10 is a diagram used to describe the coupling relationship between a cleaning liquid supply structure and a swing body.

Referring to FIG. 10, in the substrate cleaning equipment according to exemplary embodiments, each of a first cleaning liquid supply structure 340 and a second cleaning liquid supply structure 350 may be movably coupled to a swing body 320.

For example, each of the first cleaning liquid supply structure 340 and the second cleaning liquid supply structure 350 may be coupled to the swing body 320 such that each of the first cleaning liquid supply structure 340 and the second cleaning liquid supply structure 350 can move in a substantially straight line.

The swing body 320 may include a first guide rail 340GL and a second guide rail 350GL extending in the first direction X and the second direction Y.

The first cleaning liquid supply structure 340 may be movably coupled to the swing body 320 using the first guide rail 340GL. A first nozzle arm 341 may be moved in the second direction Y along the first guide rail 340GL. The first nozzle arm 341 may be movably coupled to the swing body 320.

The second cleaning liquid supply structure 350 may be movably coupled to the swing body 320 using the second guide rail 350GL. A second nozzle arm 351 may be moved in the first direction X along the second guide rail 350GL. The second nozzle arm 351 may be movably coupled to the swing body 320.

Although FIG. 10 illustrates both the first cleaning liquid supply structure 340 and the second cleaning liquid supply structure 350 being movably coupled to the swing body 320, exemplary embodiments are not limited thereto. For example, in exemplary embodiments, only one of the first cleaning liquid supply structure 340 and the second cleaning liquid supply structure 350 may be movably coupled to the swing body 320.

Figure 11:
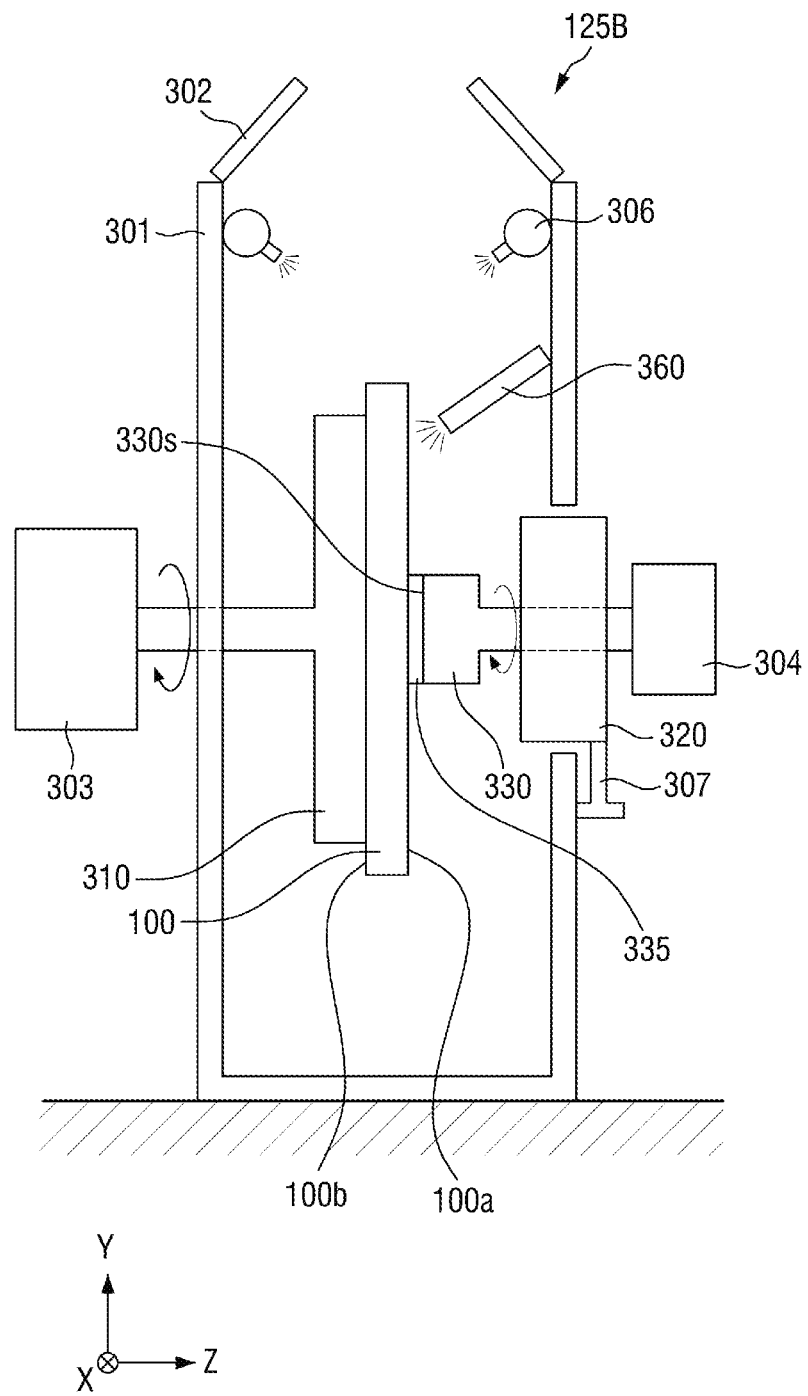
FIG. 11 is a cross-sectional view of substrate cleaning equipment according to exemplary embodiments.
Figure 12:
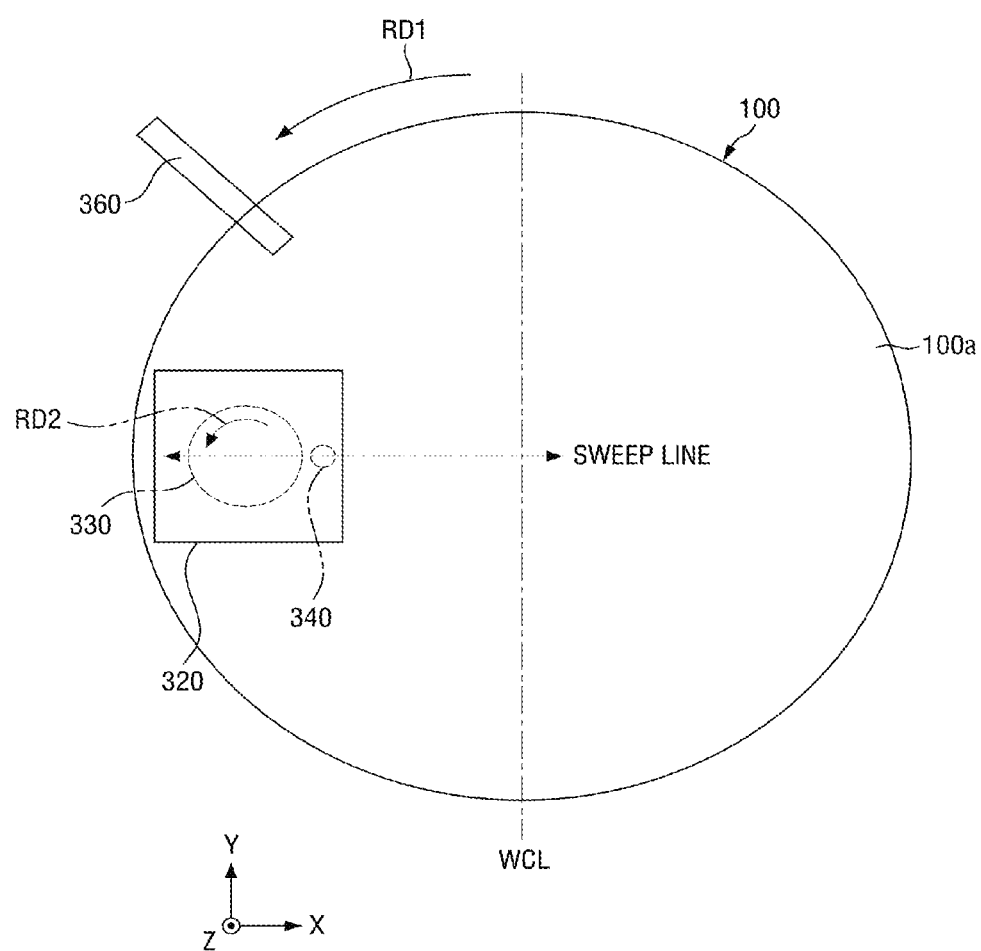
FIG. 12 illustrates a substrate, a head, a swing body, and first and third cleaning liquid supply structures of FIG. 11.

FIG. 11 is a cross-sectional view of substrate cleaning equipment 125B according to exemplary embodiments. FIG. 12 illustrates a substrate 100, a head 330, a swing body 320, and first and third cleaning liquid supply structures 340 and 360 of FIG. 11. For ease of description, the following description will primarily focus on differences from the exemplary embodiments described with reference to FIGS. 3 through 8, and a further description of elements and aspects previously described may be omitted.

Referring to FIGS. 11 and 12, the substrate cleaning equipment 125B according to exemplary embodiments may include the first cleaning liquid supply structure 340 coupled to the swing body 320, and the third cleaning liquid supply structure 360 fixed to an inner wall of a housing 301.

The third cleaning liquid supply structure 360 may spray a third cleaning liquid onto a main surface 100a of the substrate 100. The third cleaning liquid may include a chemical solution. The third cleaning liquid supply structure 360 may be connected to a liquid source which supplies the third cleaning liquid.

Figure 13:
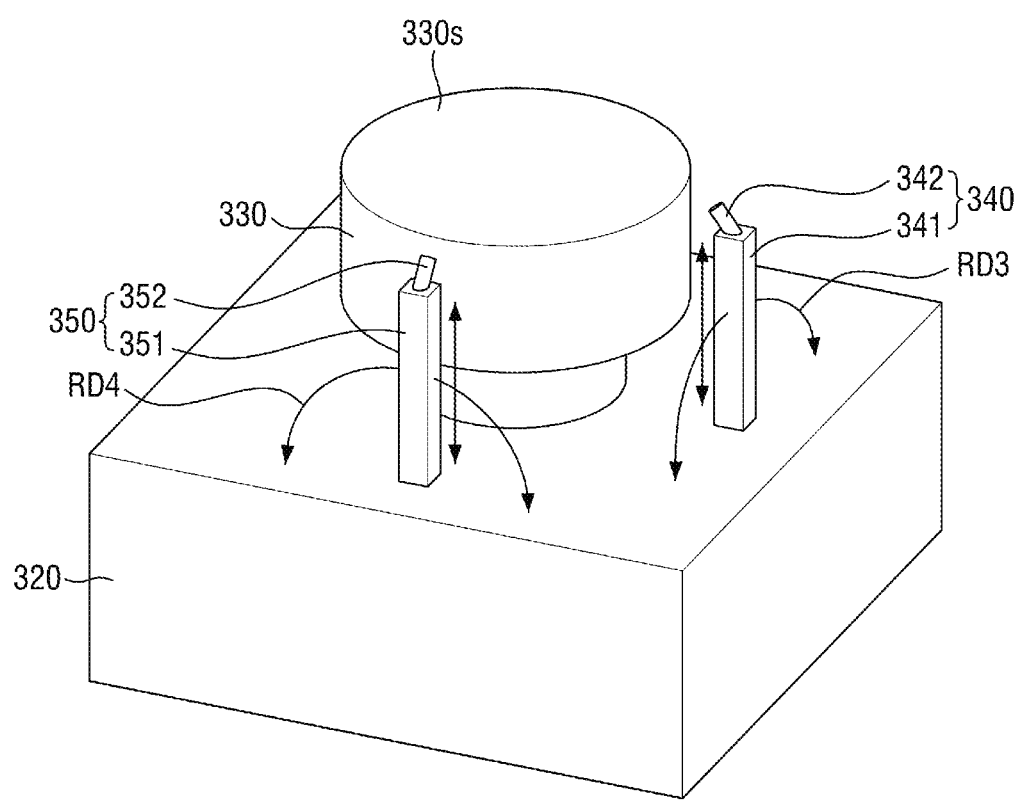
FIG. 13 illustrates substrate cleaning equipment according to exemplary embodiments.

FIG. 13 illustrates substrate cleaning equipment according to exemplary embodiments. For ease of description, the following description will focus primarily on differences from the exemplary embodiments described with reference to FIGS. 3 through 8, and a further description of elements and aspects previously described may be omitted.

For reference, FIG. 13 is a diagram used to describe the coupling relationship between a cleaning liquid supply structure and a swing body.

Referring to FIG. 13, in the substrate cleaning equipment according to exemplary embodiments, a first nozzle arm 341 may rotate relative to a point at which the first nozzle arm 341 is coupled to a swing body 320. For example, the first nozzle arm 341 may rotate in a third rotation direction RD3.

A second nozzle arm 351 may rotate relative to a point at which the second nozzle arm 351 is coupled to the swing body 320. For example, the second nozzle arm 351 may rotate in a fourth rotation direction RD4.

When a distance between an outer circumference of a pad attachment surface 330s and a cleaning liquid supply nozzle deviates from an appropriate range as a nozzle arm rotates, a length of the nozzle arm may be increased to make the distance between the outer circumference of the pad attachment surface 330s and the cleaning liquid supply nozzle fall within the appropriate range.

Although FIG. 13 illustrates both the first nozzle arm 341 and the second nozzle arm 351 being rotatable relative to a point at which each of the arms are coupled to the swing body 320, respectively, exemplary embodiments are not limited thereto. For example, in exemplary embodiments, only one of the first nozzle arm 341 and the second nozzle arm 351 may rotate relative to a point at which the arm is coupled to the swing body 320. Alternatively, only one of the first nozzle arm 341 and the second nozzle arm 351 may be extended in its longitudinal direction.

Figure 14:
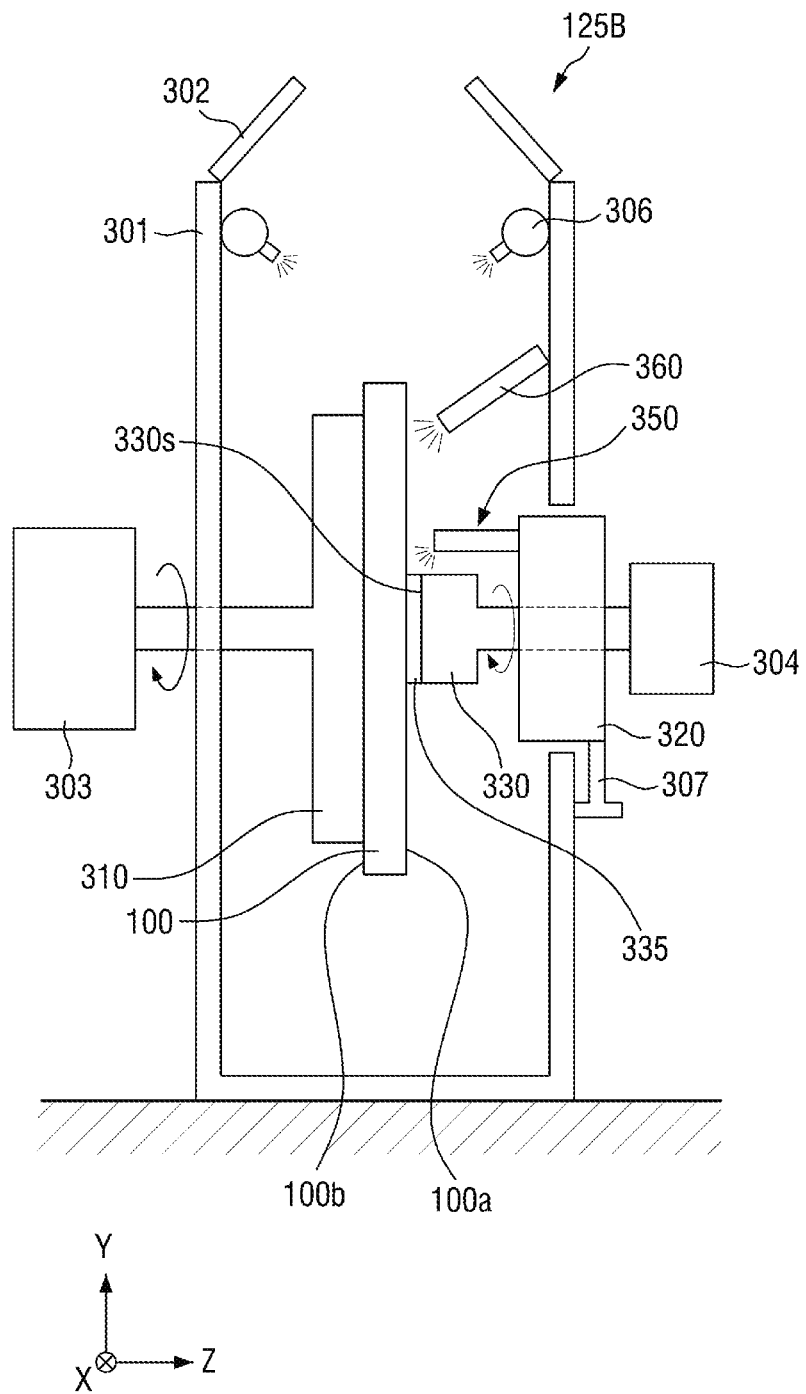
FIG. 14 is a cross-sectional view of substrate cleaning equipment according to exemplary embodiments.
Figure 15:
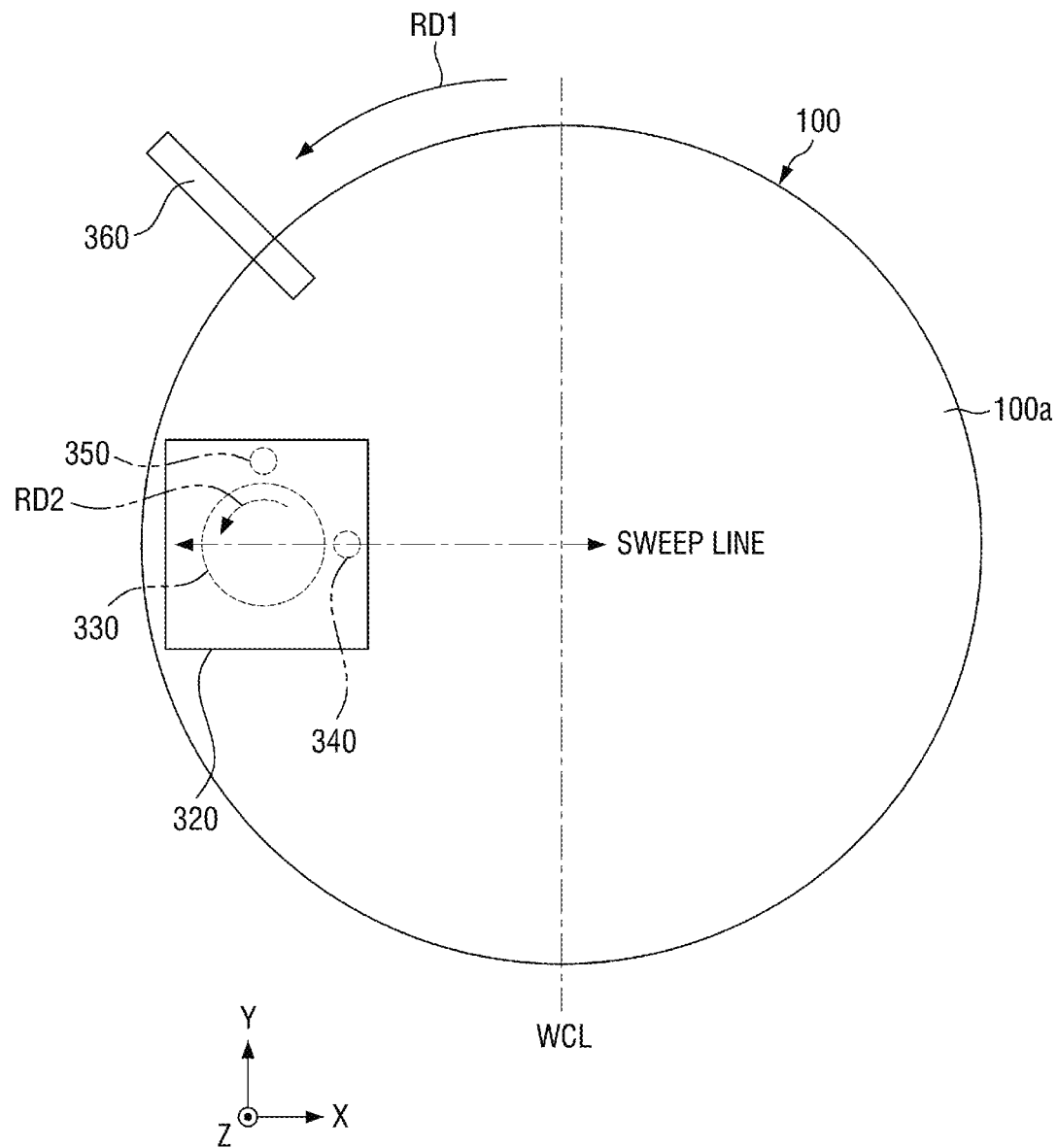
FIG. 15 illustrates a substrate, a head, a swing body, and first through third cleaning liquid supply structures of FIG. 14.

FIG. 14 is a cross-sectional view of substrate cleaning equipment 125B according to exemplary embodiments. FIG. 15 illustrates a substrate 100, a head 330, a swing body 320, and first through third cleaning liquid supply structures 340 through 360 of FIG. 14. For ease of description, the following description will primarily focus on differences from the exemplary embodiments described with reference to FIGS. 3 through 8, and a further description of elements and aspects previously described may be omitted.

Referring to FIGS. 14 and 15, the substrate cleaning equipment 125B according to exemplary embodiments may further include the third cleaning liquid supply structure 360 fixed to an inner wall of a housing 301.

The third cleaning liquid supply structure 360 may spray a third cleaning liquid onto a main surface 100a of the substrate 100. Since the third cleaning liquid is sprayed onto the main surface 100a of the substrate 100 in addition to a first cleaning liquid sprayed by the first cleaning liquid supply structure 340 and a second cleaning liquid sprayed by the second cleaning liquid supply structure 350, particles disposed on and/or attached to the main surface 100a of the substrate 100 can be removed more efficiently.

Figure 16:
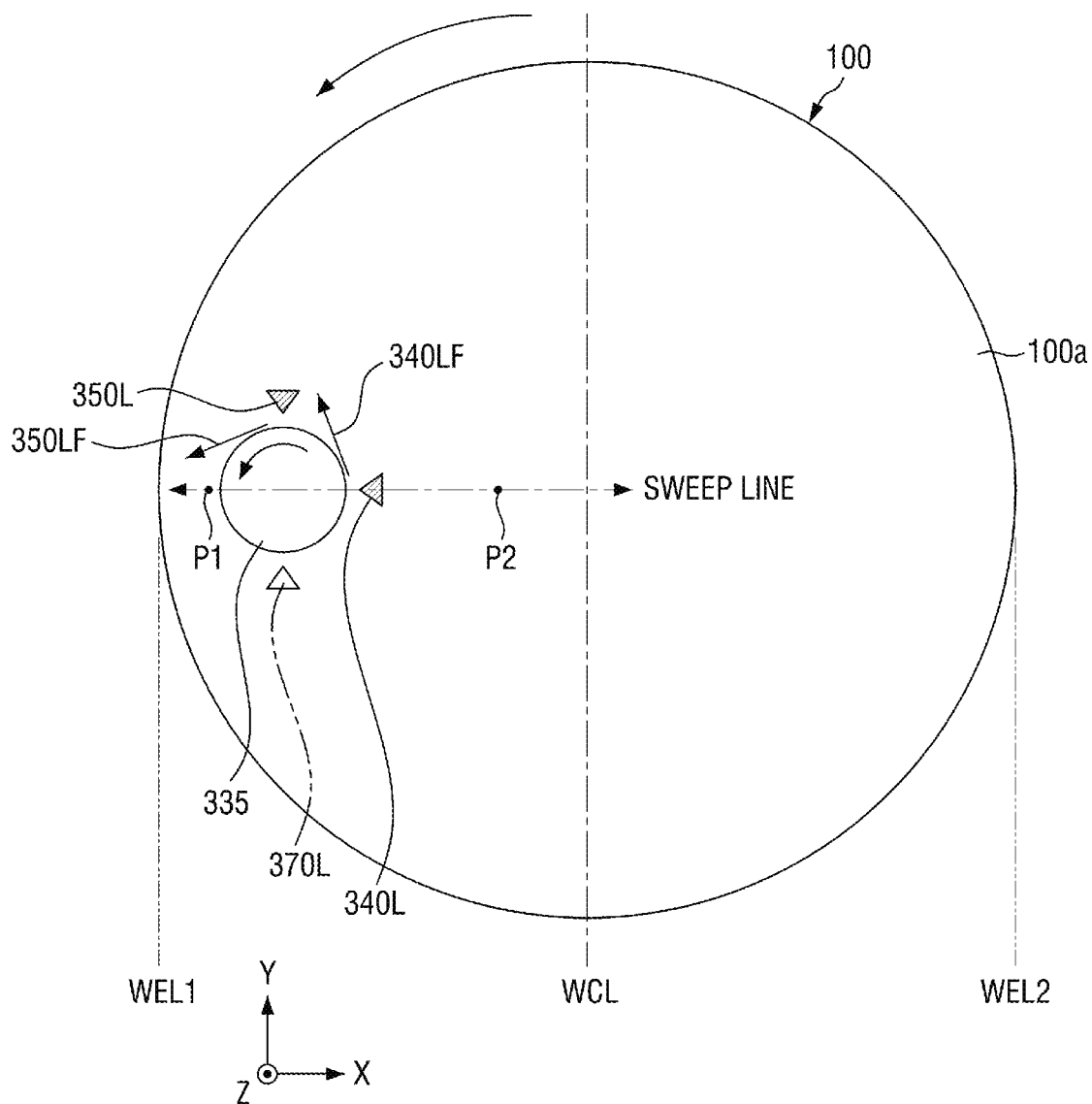
FIGS. 16 through 18 are diagrams illustrating substrate cleaning equipment according to exemplary embodiments.
Figure 17:
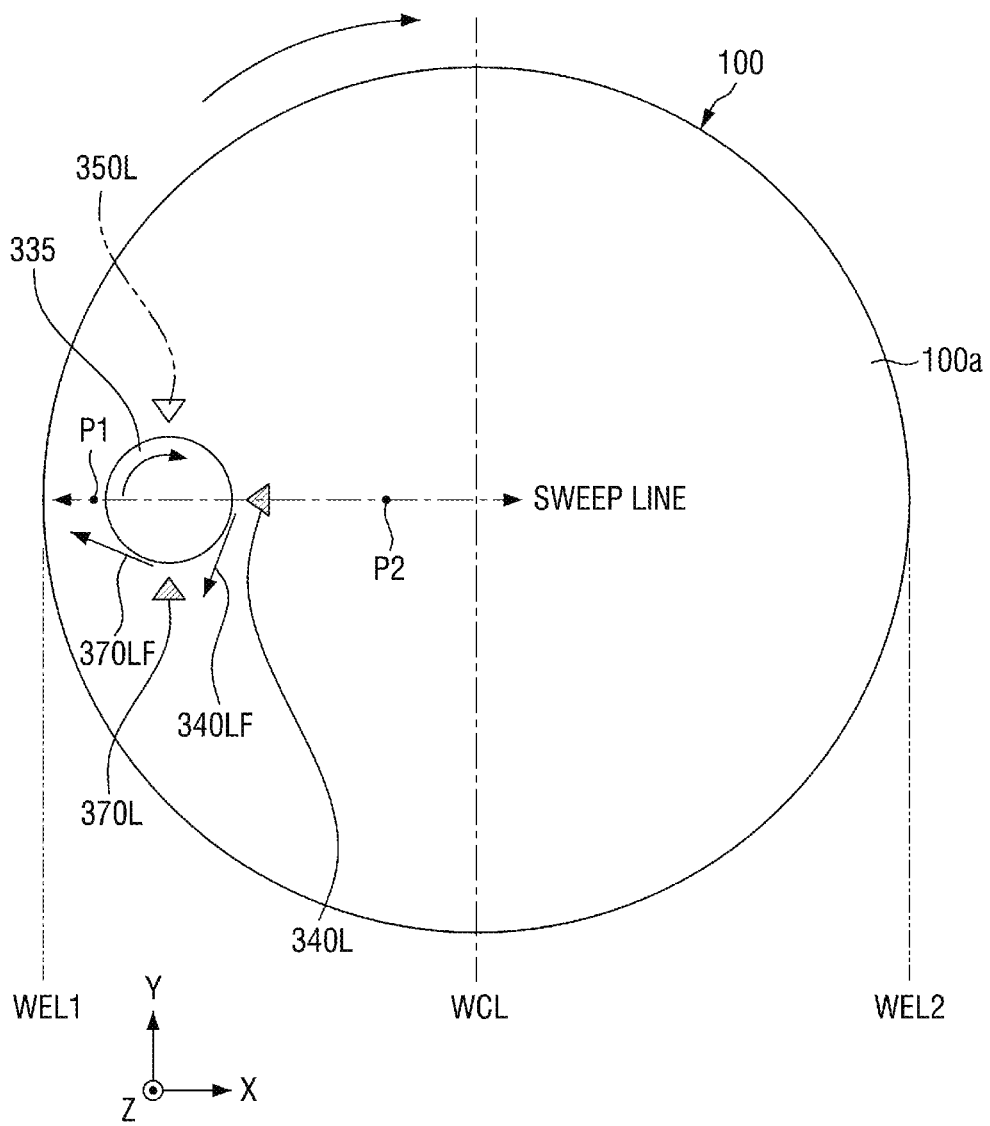
Figure 18:
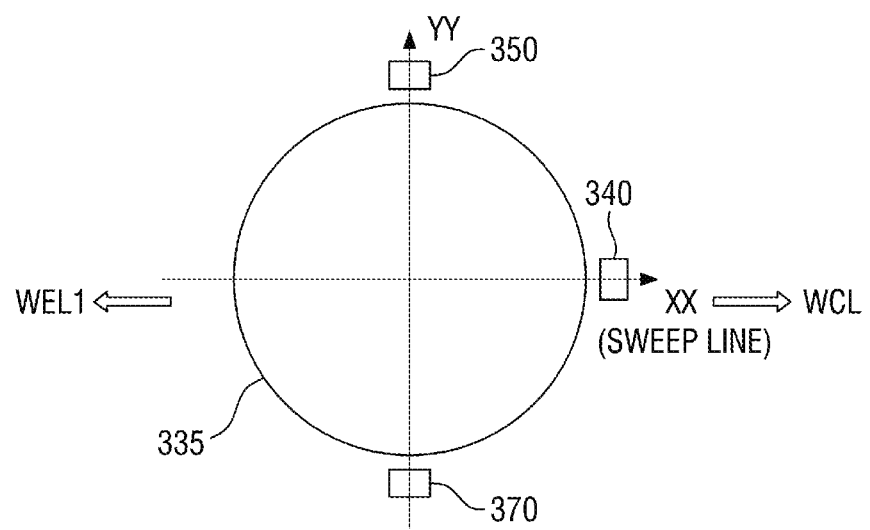

FIGS. 16 through 18 are diagrams illustrating substrate cleaning equipment 125B according to exemplary embodiments. For ease of description, the following description will primarily focus on differences from the exemplary embodiments described with reference to FIGS. 3 through 8, and a further description of elements and aspects previously described may be omitted.

For reference, FIG. 16 is a diagram used to describe the operation of the substrate cleaning equipment 125B when a substrate 100 rotates in the counterclockwise direction. FIG. 17 is a diagram used to describe the operation of the substrate cleaning equipment 125B when the substrate 100 rotates in the clockwise direction. FIG. 18 illustrates the arrangement of cleaning liquid supply structures.

Referring to FIGS. 5 and 16 through 18, the substrate cleaning equipment 125B according to exemplary embodiments may further include a fourth cleaning liquid supply structure 370 coupled to a swing body 320.

The fourth cleaning liquid supply structure 370, which sprays a fourth cleaning liquid 370L, may be disposed in an area at which a YY axis of an XX-YY plane has a negative value.

A first cleaning liquid supply structure 340 may be disposed on a sweep line SWEEP LINE, and a second cleaning liquid supply structure 350 and the fourth cleaning liquid supply structure 370 may face each other with a buffing pad 335 interposed between them. For example, the second cleaning liquid supply structure 350 and the fourth cleaning liquid supply structure 370 may face each other with a head 330 interposed between them.

In FIG. 16, the substrate 100 may rotate in the counterclockwise direction. When the substrate 100 rotates in the counterclockwise direction, most of a first cleaning liquid 340L moves in a first cleaning liquid flow direction 340LF toward a rim of the substrate 100. In addition, most of a second cleaning liquid 350L moves in a second cleaning liquid flow direction 350LF toward the rim of the substrate 100.

On the other hand, when the fourth cleaning liquid supply structure 370 sprays the fourth cleaning liquid 370L to a main surface 100a of the substrate 100, the fourth cleaning liquid 370L may gather at or near a center of the substrate 100.

Therefore, when the substrate 100 rotates in the counterclockwise direction, the first cleaning liquid supply structure 340 and the second cleaning liquid supply structure 350 may be activated so that the first cleaning liquid 340L and the second cleaning liquid 350L can be sprayed onto the main surface 100a of the substrate 100. On the other hand, the fourth cleaning liquid supply structure 370 may be deactivated so that the fourth cleaning liquid 370L is not sprayed onto the main surface 100a of the substrate 100.

In FIG. 16, the first cleaning liquid 340L and the second cleaning liquid 350L are hatched. This indicates that the first cleaning liquid supply structure 340 and the second cleaning liquid supply structure 350 have been activated.

In FIG. 17, the substrate 100 may rotate in the clockwise direction. When the substrate 100 rotates in the clockwise direction, most of the first cleaning liquid 340L moves in the first cleaning liquid flow direction 340LF toward the rim of the substrate 100. In addition, most of the fourth cleaning liquid 370L moves in a fourth cleaning liquid flow direction 370LF toward the rim of the substrate 100.

On the other hand, when the second cleaning liquid supply structure 350 sprays the second cleaning liquid 350L onto the main surface 100a of the substrate 100, the second cleaning liquid 350L may gather at or near the center of the substrate 100.

Therefore, when the substrate 100 rotates in the clockwise direction, the first cleaning liquid supply structure 340 and the fourth cleaning liquid supply structure 370 may be activated so that the first cleaning liquid 340L and the fourth cleaning liquid 370L can be sprayed onto the main surface 100a of the substrate 100. On the other hand, the second cleaning liquid supply structure 350 may be deactivated so that the second cleaning liquid 350L is not sprayed onto the main surface 100a of the substrate 100.

In FIG. 17, the first cleaning liquid 340L and the fourth cleaning liquid 370L are hatched. This indicates that the first cleaning liquid supply structure 340 and the fourth cleaning liquid supply structure 370 have been activated.

Depending on the rotation direction of the substrate 100, one of the second cleaning liquid supply structure 350 and the fourth cleaning liquid supply structure 370 may be made to spray a cleaning liquid, and the other may be made not to spray a cleaning liquid.

FIGS. 19 through 22 are diagrams illustrating substrate cleaning equipment 125B according to exemplary embodiments. For ease of description, the following description will primarily focus on differences from the exemplary embodiments described with reference to FIGS. 3 through 8, and a further description of elements and aspects previously described may be omitted.

Figure 19:
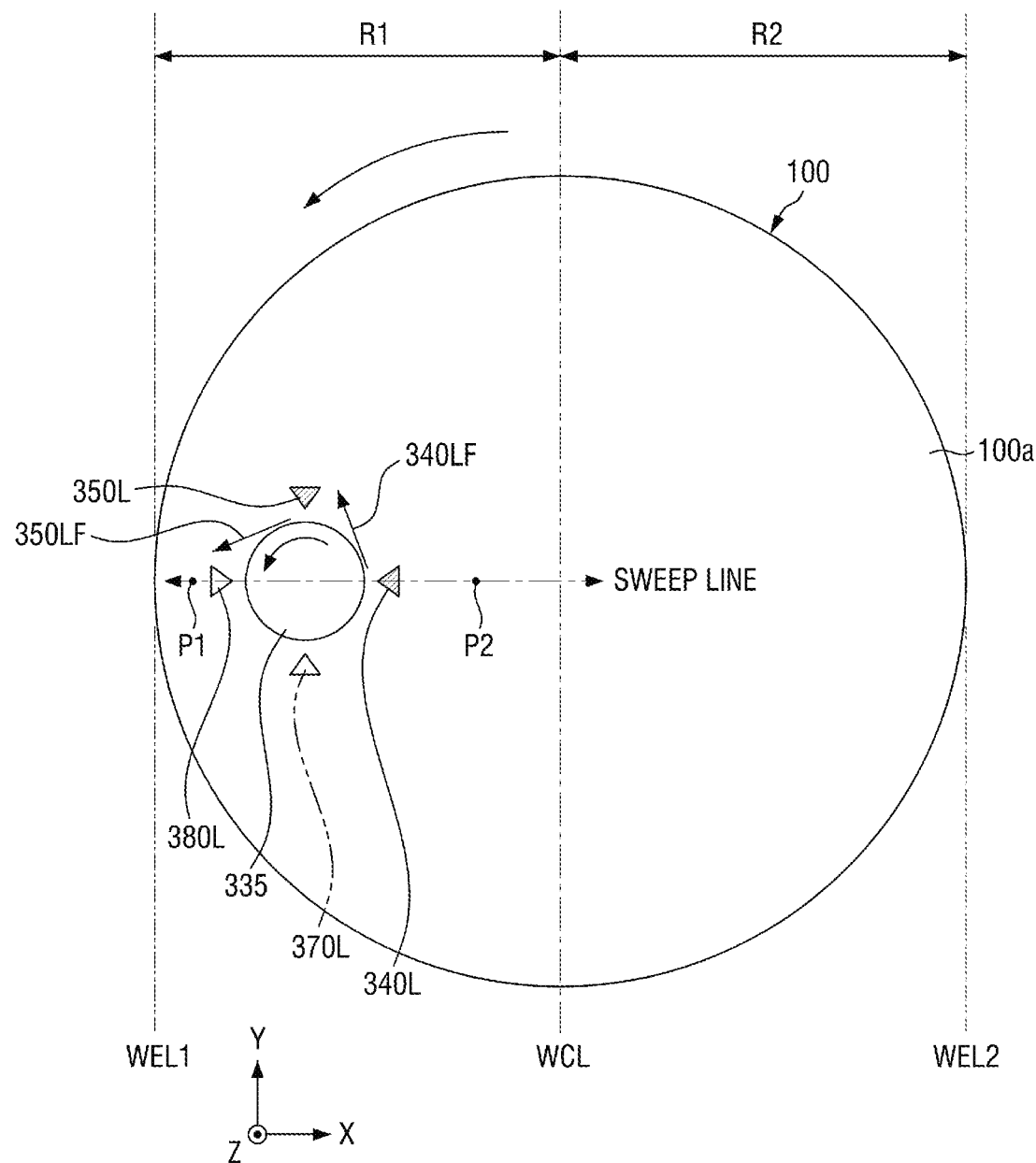
FIGS. 19 through 22 are diagrams illustrating substrate cleaning equipment according to exemplary embodiments.
Figure 20:
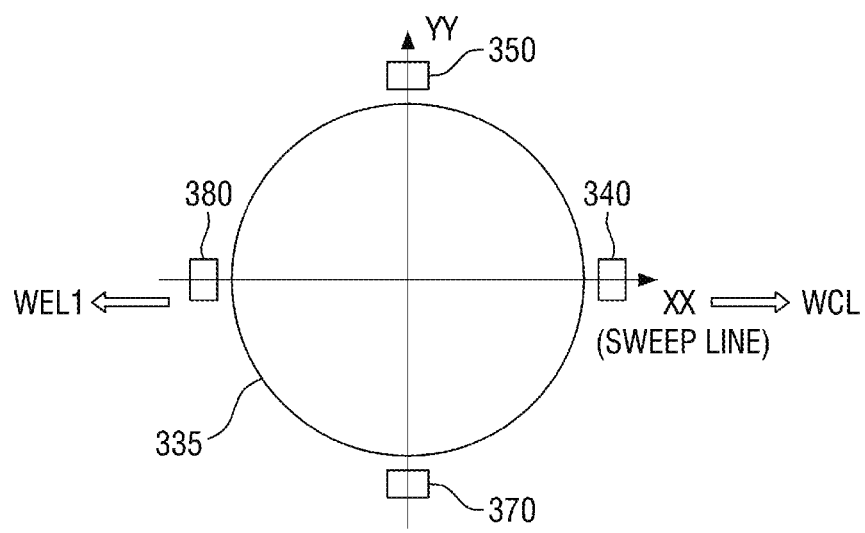
Figure 21:
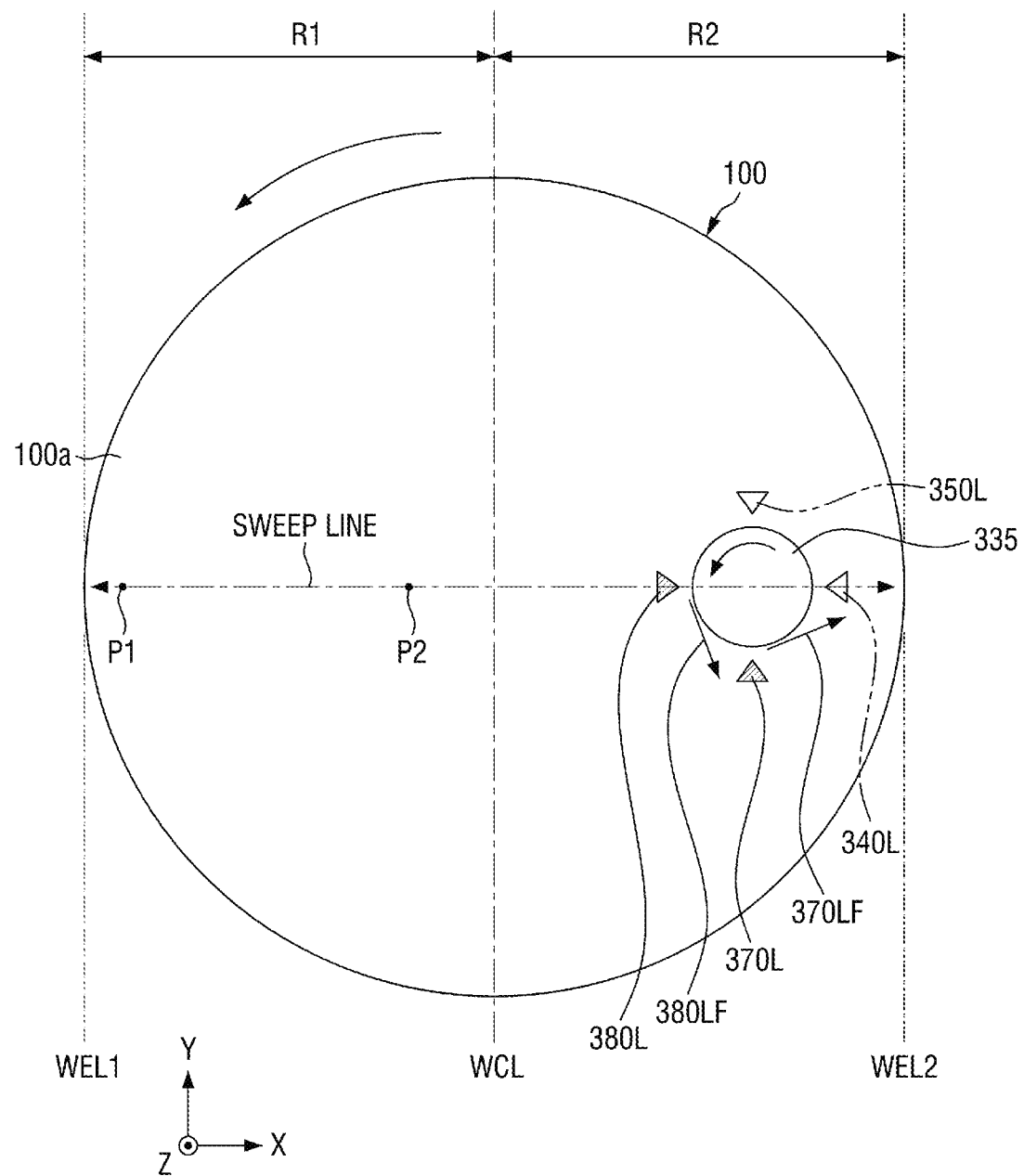
Figure 22:
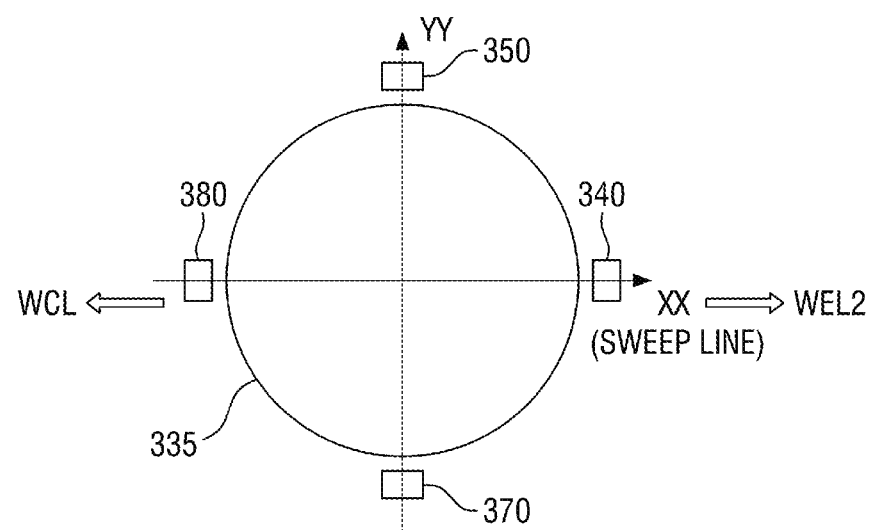

For reference, FIG. 19 is a diagram used to describe the operation of the substrate cleaning equipment 125B when a swing body 320 moves on a side of a substrate center line WCL. FIG. 21 is a diagram used to describe the operation of the substrate cleaning equipment 125B when the swing body 320 moves on the other side of the substrate center line WCL, relative to FIG. 19. FIGS. 20 and 22 illustrate the arrangement of cleaning liquid supply structures.

Referring to FIGS. 5 and 19 through 22, the substrate cleaning equipment 125B according to exemplary embodiments may further include a fourth cleaning liquid supply structure 370 and a fifth cleaning liquid supply structure 380 coupled to the swing body 320.

The fourth cleaning liquid supply structure 370, which sprays a fourth cleaning liquid 370L, may be disposed in an area in which a YY axis of an XX-YY plane has a negative value. The fifth cleaning liquid supply structure 380, which sprays a fifth cleaning liquid 380L, may be disposed in an area in which an XX axis of the XX-YY plane has a negative value.

A first cleaning liquid supply structure 340 and the fifth cleaning liquid supply structure 380 may be disposed on a sweep line SWEEP LINE. The first cleaning liquid supply structure 340 and the fifth cleaning liquid supply structure 380 may face each other with a buffing pad 335 interposed between them. A second cleaning liquid supply structure 350 and the fourth cleaning liquid supply structure 370 may face each other with the buffing pad 335 interposed between them.

For example, the first cleaning liquid supply structure 340 and the fifth cleaning liquid supply structure 380 may face each other with a head 330 interposed between them, and the second cleaning liquid supply structure 350 and the fourth cleaning liquid supply structure 370 may face each other with the head 330 interposed between them.

When the buffing pad 335 moves along the sweep line SWEEP LINE as the substrate cleaning equipment 125B operates, a center of the buffing pad 335, for example, a center of the head 330, may pass through the substrate center line WCL. While moving along the sweep line SWEEP LINE, the buffing pad 335 may pass through a first substrate edge line WEL1 and the substrate center line WCL, and may also pass through a second substrate edge line WEL2.

For example, the movement of the swing body 320 along the sweep line SWEEP LINE may proceed from a first side R1 to a second side R2 of a center of the substrate 100, for example, the substrate center line WCL.

The substrate 100 may rotate in the counterclockwise direction.

In FIGS. 19 and 20, when the swing body 320 moves on the first side R1 of the substrate 100, most of a first cleaning liquid 340L moves in a first cleaning liquid flow direction 340LF toward a rim of the substrate 100. In addition, most of a second cleaning liquid 350L moves in a second cleaning liquid flow direction 350LF toward the rim of the substrate 100.

On the other hand, when the fourth cleaning liquid supply structure 370 sprays the fourth cleaning liquid 370L onto a main surface 100a of the substrate 100, the fourth cleaning liquid 370L may gather at or near the center of the substrate 100. In addition, when the fifth cleaning liquid supply structure 380 sprays the fifth cleaning liquid 380L onto the main surface 100a of the substrate 100, the fifth cleaning liquid 380L may gather at or near the center of the substrate 100.

Therefore, when the swing body 320 moves on the first side R1 of the substrate 100, the first cleaning liquid supply structure 340 and the second cleaning liquid supply structure 350 may be activated so that the first cleaning liquid 340L and the second cleaning liquid 350L can be sprayed onto the main surface 100a of the substrate 100. On the other hand, the fourth cleaning liquid supply structure 370 and the fifth cleaning liquid supply structure 380 may be deactivated so that the fourth cleaning liquid 370L and the fifth cleaning liquid 380L are not sprayed onto the main surface 100a of the substrate 100.

In FIG. 19, the first cleaning liquid 340L and the second cleaning liquid 350L are hatched. This indicates that the first cleaning liquid supply structure 340 and the second cleaning liquid supply structure 350 have been activated.

In FIGS. 21 and 22, when the swing body 320 moves on the second side R2 of the substrate 100, most of the fourth cleaning liquid 370L moves in a fourth cleaning liquid flow direction 370LF toward the rim of the substrate 100. In addition, most of the fifth cleaning liquid 380L moves in a fifth cleaning liquid flow direction 380LF toward the rim of the substrate 100.

On the other hand, when the first cleaning liquid supply structure 340 sprays the first cleaning liquid 340L onto the main surface 100a of the substrate 100, the first cleaning liquid 340L may gather at or near the center of the substrate 100. In addition, when the second cleaning liquid supply structure 350 sprays the second cleaning liquid 350L onto the main surface 100a of the substrate 100, the second cleaning liquid 350L may gather at or near the center of the substrate 100.

Therefore, when the swing body 320 moves on the second side R2 of the substrate 100, the fourth cleaning liquid supply structure 370 and the fifth cleaning liquid supply structure 380 may be activated so that the fourth cleaning liquid 370L and the fifth cleaning liquid 380L can be sprayed onto the main surface 100a of the substrate 100. On the other hand, the first cleaning liquid supply structure 340 and the second cleaning liquid supply structure 350 may be deactivated so that the first cleaning liquid 340L and the second cleaning liquid 350L are not sprayed onto the main surface 100a of the substrate 100.

In FIG. 21, the fourth cleaning liquid 370L and the fifth cleaning liquid 380L are hatched. This indicates that the fourth cleaning liquid supply structure 370 and the fifth cleaning liquid supply structure 380 have been activated.

Figure 23:
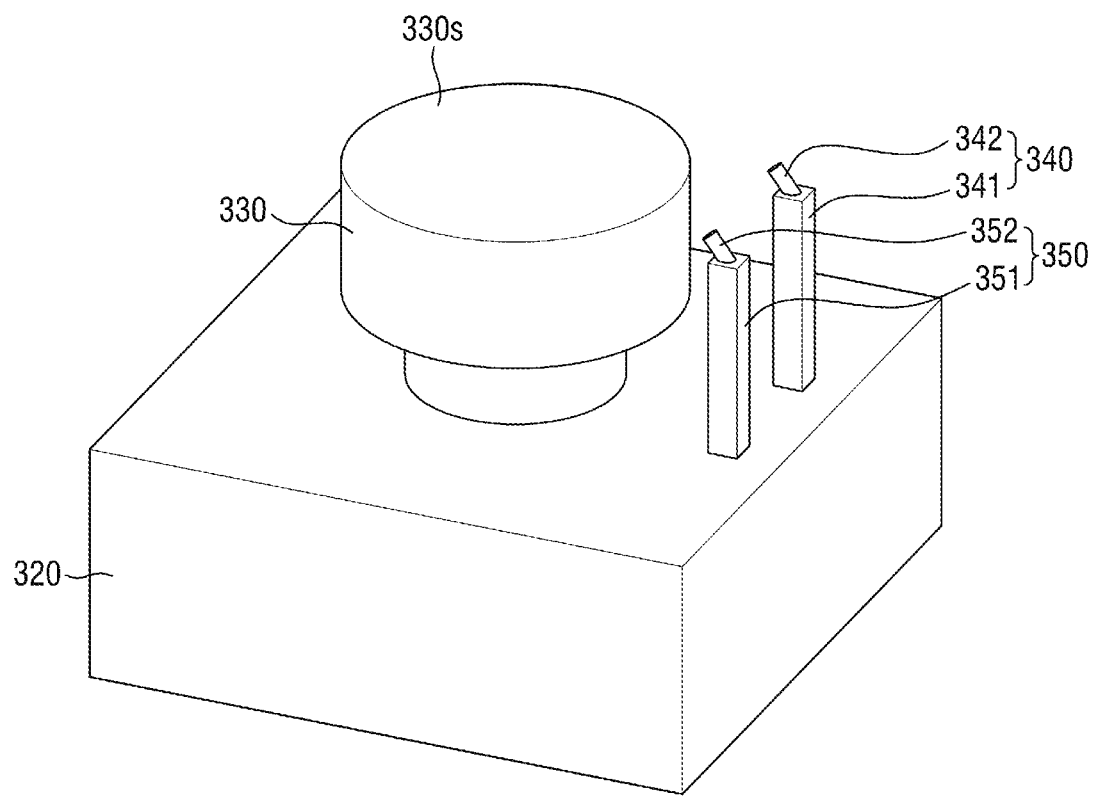
FIGS. 23 and 24 are diagrams illustrating substrate cleaning equipment according to exemplary embodiments.
Figure 24:
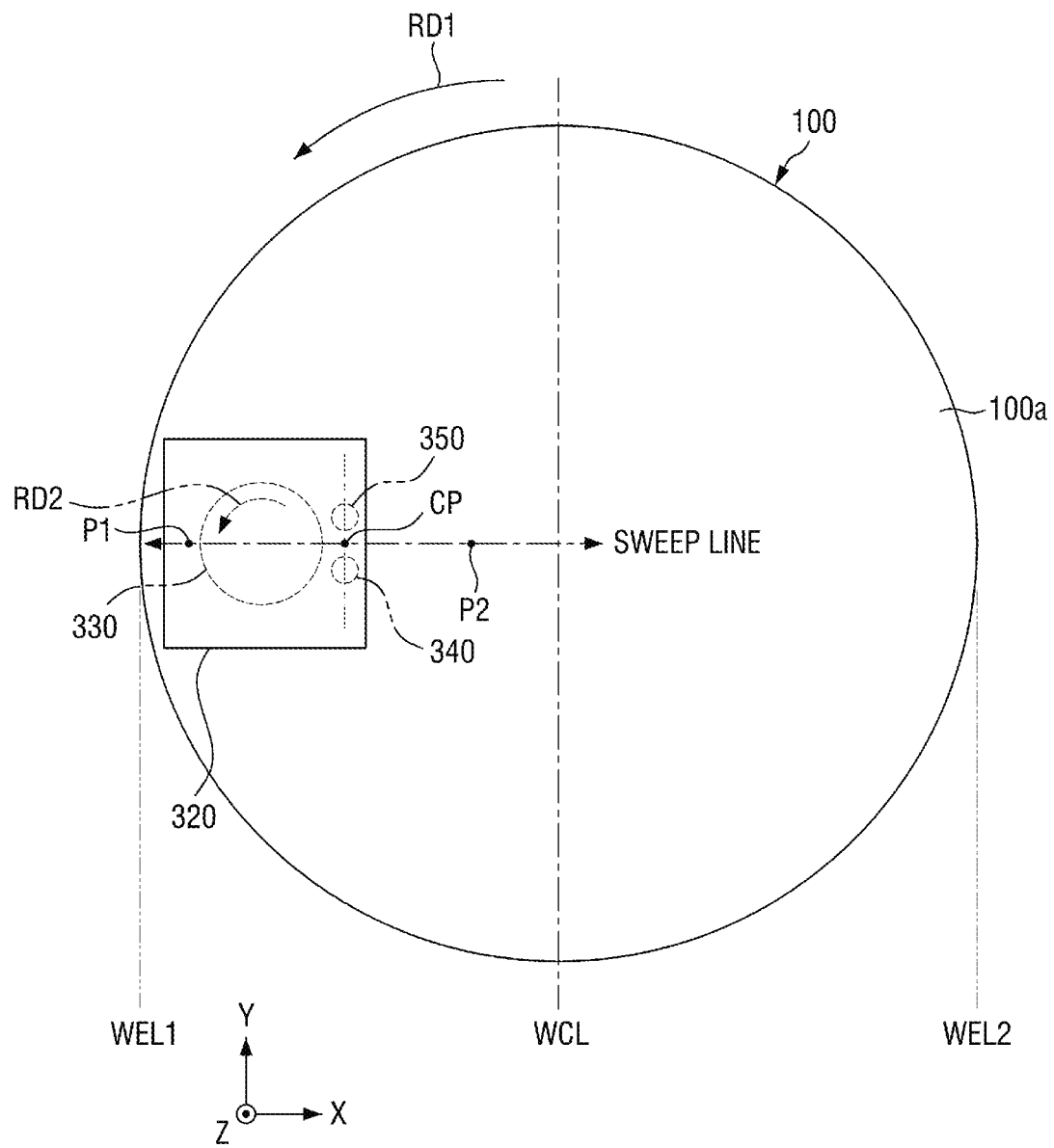

FIGS. 23 and 24 are diagrams illustrating substrate cleaning equipment according to exemplary embodiments. For ease of description, the following description will primarily focus on differences from the exemplary embodiments described with reference to FIGS. 3 through 8, and a further description of elements and aspects previously described may be omitted.

Referring to FIGS. 23 and 24, in the substrate cleaning equipment according to exemplary embodiments, a first cleaning liquid supply structure 340 and a second cleaning liquid supply structure 350 may face each other with a sweep line SWEEP LINE interposed between them. For example, the sweep line SWEEP LINE may extend through an area separating the first cleaning liquid supply structure 340 and the second cleaning liquid supply structure 350.

A connection line passing through the first cleaning liquid supply structure 340 and the second cleaning liquid supply structure 350 may be defined. In FIG. 24, the connection line is the dashed vertical line extending through the first cleaning liquid supply structure 340 and the second cleaning liquid supply structure 350. Although the connection line is illustrated as being substantially parallel to a substrate center line WCL in FIG. 24, this is merely an example used for ease of description, and exemplary embodiments are not limited to this example.

The sweep line SWEEP LINE may include an intersection point CP that intersects the connection line.

While a swing body 320 moves from a first point P1 toward a second point P2, a distance from a first substrate edge line WEL1 to the intersection point CP is greater than a distance from the first substrate edge line WEL1 to a center of a head 330.

For example, the distance from a point at which the first substrate edge line WEL1 meets a substrate 100 to the intersection point CP is greater than the distance from the point at which the first substrate edge line WEL1 meets the substrate 100 to the center of the head 330.

Figure 25:
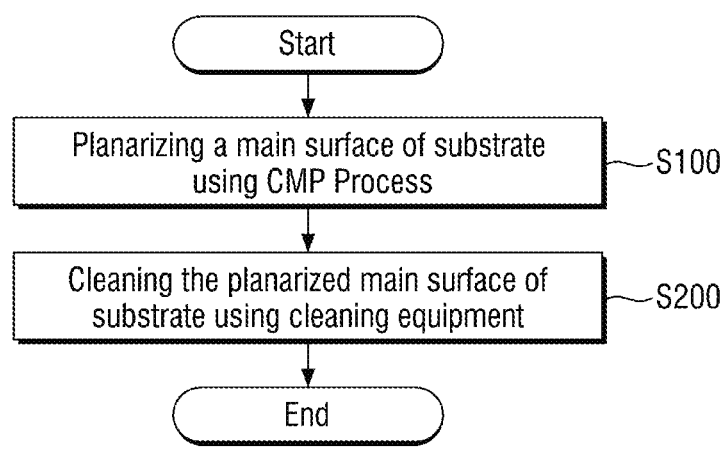
FIG. 25 is a flowchart illustrating a method of fabricating a semiconductor device using substrate cleaning equipment according to exemplary embodiments.

FIG. 25 is a flowchart illustrating a method of fabricating a semiconductor device using substrate cleaning equipment according to exemplary embodiments.

Referring to FIG. 25, a main surface 100a (see FIG. 3) of a substrate 100 may be planarized using a CMP process (operation S100).

The CMP process may be performed using the CMP equipment 110 of FIG. 1.

Next, the planarized main surface 100a of the substrate 100 may be cleaned using substrate cleaning equipment 125B (see FIG. 2) (operation S200).

The substrate cleaning equipment 125B may be one of the pieces of substrate cleaning equipment described with reference to FIGS. 3 through 24.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. Substrate cleaning equipment, comprising:
a substrate holder which supports a substrate;
a swing body which moves along a sweep line on a main surface of the substrate, wherein the swing body includes a first surface facing the main surface of the substrate;
a head which is coupled to the swing body and comprises a pad attachment surface facing the substrate holder, wherein the head is disposed on the first surface of the swing body;
a first cleaning liquid supply structure which is coupled to the swing body and sprays a first cleaning liquid onto the main surface of the substrate; and
a second cleaning liquid supply structure which is coupled to the swing body and sprays a second cleaning liquid onto the main surface of the substrate,
wherein a buffing pad is attached to the pad attachment surface,
wherein the first cleaning liquid supply structure comprises a first nozzle arm movably coupled to the swing body and a first cleaning liquid supply nozzle coupled to the first nozzle arm,
wherein the first nozzle arm is directly attached to and extends from the first surface of the swing body toward the main surface of the substrate,
wherein the second cleaning liquid supply structure comprises a second nozzle arm movably coupled to the swing body and a second cleaning liquid supply nozzle coupled to the second nozzle arm,
wherein the first nozzle arm is movable in a first straight line on the first surface of the swing body, and the second nozzle arm is movable in a second straight line on the first surface of the swing body, and
wherein the first straight line along which the first nozzle arm is movable is orthogonal to the second straight line along which the second nozzle arm is movable.

2. The substrate cleaning equipment of claim 1, wherein a rotation direction of the substrate is the same as a rotation direction of the buffing pad.

3. The substrate cleaning equipment of claim 1, wherein the swing body comprises a guide rail extending in a direction, and the first nozzle arm moves along the guide rail.

4. The substrate cleaning equipment of claim 1, wherein the first cleaning liquid supply nozzle is rotatably coupled to the first nozzle arm.

5. The substrate cleaning equipment of claim 1, wherein the swing body comprises a guide rail extending in a direction, and the second nozzle arm moves along the guide rail.

6. The substrate cleaning equipment of claim 1, wherein
the substrate rotates in a counterclockwise direction,
the swing body passes through a first point and a second point on the sweep line, and
when the sweep line is an X axis, a Y axis is substantially perpendicular to the X axis, an X-Y plane is substantially parallel to the main surface of the substrate, a direction from the first point toward the second point is a positive direction of the X axis, a direction in which the buffing pad is visible from the substrate is a positive direction of a Z axis, and a center of the buffing pad is an origin of the X-Y plane, each of the first cleaning liquid supply structure and the second cleaning liquid supply structure is located in an area in which the X axis has a positive value or an area in which the Y axis of the X-Y plane has a positive value.

7. The substrate cleaning equipment of claim 6, wherein a first line passing through a center of the pad attachment surface and the first cleaning liquid supply structure is substantially perpendicular to a second line passing through the center of the pad attachment surface and the second cleaning liquid supply structure.

8. The substrate cleaning equipment of claim 1, wherein
the first cleaning liquid supply structure and the second cleaning liquid supply structure face each other with the sweep line interposed between the first cleaning liquid supply structure and the second cleaning liquid supply structure,
the sweep line comprises an intersection point that intersects a connection line passing through the first cleaning liquid supply structure and the second cleaning liquid supply structure,
the sweep line comprises a first point located at a first distance from an edge line of the substrate and a second point located at a second distance farther than the first distance from the edge line of the substrate, and
a third distance from the edge line of the substrate to a center of the head is less than a fourth distance from the edge line of the substrate to the intersection point while the swing body moves from the first point toward the second point.

9. The substrate cleaning equipment of claim 1, further comprising:
a housing which accommodates the substrate holder, wherein a third cleaning liquid supply structure is fixed to an inner wall of the housing.

10. The substrate cleaning equipment of claim 1, wherein a center of the head passes through a center of the substrate while the buffing pad cleans the main surface of the substrate while moving along the sweep line.

11. The substrate cleaning equipment of claim 1, wherein the substrate holder keeps the substrate vertically oriented while the main surface of the substrate is cleaned using the buffing pad.

12. The substrate cleaning equipment of claim 1, further comprising:
a third cleaning liquid supply structure which is coupled to the swing body and sprays a third cleaning liquid onto the main surface of the substrate; and
a fourth cleaning liquid supply structure which is coupled to the swing body and sprays a fourth cleaning liquid onto the main surface of the substrate,
wherein the first cleaning liquid supply structure and the third cleaning liquid supply structure are located along the sweep line with the head interposed between the first cleaning liquid supply structure and the third cleaning liquid supply structure, and
the second cleaning liquid supply structure and the fourth cleaning liquid supply structure are located on each opposite sides of the sweep line with the head interposed between the second cleaning liquid supply structure and the fourth cleaning liquid supply structure.

13. The substrate cleaning equipment of claim 12, wherein when the swing body moves along the sweep line on a first side of a center of the substrate, each of the first cleaning liquid supply structure and the second cleaning liquid supply structure sprays its respective cleaning liquid, and each of the third cleaning liquid supply structure and the fourth cleaning liquid supply structure does not spray its respective cleaning liquid, and
when the swing body passes through the center of the substrate and moves along the sweep line on a second side of the center of the substrate opposite to the first side of the center of the substrate, each of the third cleaning liquid supply structure and the fourth cleaning liquid supply structure sprays its respective cleaning liquid, and each of the first cleaning liquid supply structure and the second cleaning liquid supply structure does not spray its respective cleaning liquid.

14. A substrate treatment system for treating a substrate, the system comprising:
chemical mechanical planarization (CMP) equipment; and
substrate cleaning equipment which receives the substrate after a main surface of the substrate is planarized by the CMP equipment,
wherein the substrate cleaning equipment comprises:
a substrate holder which supports the substrate;
a swing body which moves along a sweep line on the main surface of the substrate,
wherein the swing body includes a first surface facing the main surface of the substrate;
a head which is coupled to the swing body and comprises a pad attachment surface facing the substrate holder, wherein the head is disposed on the first surface of the swing body;
a first cleaning liquid supply structure which is coupled to the swing body and sprays a first cleaning liquid onto the main surface of the substrate; and
a second cleaning liquid supply structure which is coupled to the swing body and sprays a second cleaning liquid onto the main surface of the substrate,
wherein a buffing pad is attached to the pad attachment surface,
wherein the first cleaning liquid supply structure comprises a first nozzle arm movably coupled to the swing body and a first cleaning liquid supply nozzle coupled to the first nozzle arm,
wherein the first nozzle arm is directly attached to and extends from the first surface of the swing body toward the main surface of the substrate,
wherein the second cleaning liquid supply structure comprises a second nozzle arm movably coupled to the swing body and a second cleaning liquid supply nozzle coupled to the second nozzle arm,
wherein the first nozzle arm is movable in a first straight line on the first surface of the swing body, and the second nozzle arm is movable in a second straight line on the first surface of the swing body, and
wherein the first straight line along which the first nozzle arm is movable is orthogonal to the second straight line along which the second nozzle arm is movable.

15. The system of claim 14, wherein a center of the head passes through a center of the substrate while the buffing pad cleans the main surface of the substrate while moving along the sweep line.

* * * * *